(12) United States Patent
Weber et al.

(10) Patent No.: US 7,283,372 B2
(45) Date of Patent: Oct. 16, 2007

(54) CIRCUIT ELEMENT HAVING A FIRST LAYER OF AN ELECTRICALLY INSULATING SUBSTRATE MATERIAL AND METHOD FOR MANUFACTURING A CIRCUIT ELEMENT

(75) Inventors: Werner Weber, Munich (DE); Gunter Schmid, Hemhofen (DE); Richard J. Luyken, Munich (DE); Roland Thewes, Grobenzell (DE); Markus Seitz, Munich (DE)

(73) Assignee: Infineon Technologies AG (DE)

( * ) Notice: Subject to any disclaimer, the term of this patent is extended or adjusted under 35 U.S.C. 154(b) by 683 days.

(21) Appl. No.: 10/857,635

(22) Filed: May 28, 2004

(65) Prior Publication Data

US 2005/0017759 A1    Jan. 27, 2005

(30) Foreign Application Priority Data

May 28, 2003 (DE) ............................. 103 24 388

(51) Int. Cl.
  *H05K 7/02* (2006.01)
  *H05K 7/06* (2006.01)
  *H05K 7/08* (2006.01)
  *H05K 7/10* (2006.01)
(52) U.S. Cl. .................. 361/760; 361/761; 257/40
(58) Field of Classification Search ........ 361/760–766; 257/40, E45.002; 428/209, 690
See application file for complete search history.

(56) References Cited

U.S. PATENT DOCUMENTS

| 3,842,108 A | 10/1974 | Sutton et al. |
| 3,907,852 A | 9/1975 | Oswald et al. |
| 4,134,906 A | 1/1979 | Oswald et al. |
| 4,965,234 A | 10/1990 | Luft et al. |

(Continued)

FOREIGN PATENT DOCUMENTS

DE    199 59 904 C2    6/2001

(Continued)

OTHER PUBLICATIONS

Collier, C. P., et al., "Electronically Configurable Molecular-Based Logic Gates", Science, Jul. 16, 1999, vol. 285, pp. 391-394.

(Continued)

*Primary Examiner*—Tuan T. Dinh
(74) *Attorney, Agent, or Firm*—Dickstein, Shapiro, LLP.

(57) ABSTRACT

Circuit element having a first layer composed of an electrically insulating substrate material, a first electrically conductive material which is in the form of at least one discrete area, such that it is embedded in or applied to the substrate material, a second layer having a second electrically conductive material, and a monomolecular layer, which is composed of electrically active molecules which transports charge carriers, arranged between the first layer and the second layer. The monomolecular layer is immobilized and makes electrical contact with the second layer. Each of the electrically active molecules has a first unit, which is used as an electron donor, a second unit, which is used as an electron acceptor, wherein the electron donor and the electron acceptor form a diode, and at least one redox-active unit, by means of which a variable resistance is formed, arranged between the first unit and the second unit.

25 Claims, 12 Drawing Sheets

U.S. PATENT DOCUMENTS

| | | | |
|---|---|---|---|
| 5,063,417 | A | 11/1991 | Hopfield |
| 5,444,651 | A * | 8/1995 | Yamamoto et al. ......... 365/108 |
| 6,212,093 | B1 | 4/2001 | Lindsey |
| 6,998,637 | B2 * | 2/2006 | Luyken et al. ................ 257/40 |
| 2002/0179898 | A1 | 12/2002 | Marks et al. |

FOREIGN PATENT DOCUMENTS

| | | |
|---|---|---|
| DE | 101 23 364 A1 | 11/2002 |
| DE | 101 32 640 A1 | 1/2003 |
| WO | WO-96/07487 A1 | 3/1996 |
| WO | WO-02/35580 A2 | 5/2002 |
| WO | WO-02/49124 A2 | 6/2002 |
| WO | WO-02/071139 A1 | 9/2002 |
| WO | WO 03/005369 A3 | 1/2003 |
| WO | WO-03/041182 A2 | 5/2003 |

OTHER PUBLICATIONS

Collier, Charles P., et al., "A [2]Catenane-Based Solid State Electronically Reconfigurable Switch", Science, Aug. 18, 2000, vol. 289, pp. 1172-1175.

Gittins, David I., et al., "A nanometre-scale electronic switch consisting of a metal cluster and redox-addressable groups", Nature, Nov. 2, 2000, vol. 408, pp. 67-69.

Reed, M. A., et al., "Prospects for Molecular-Scale Devices", IEEE, Tech. Digest, 1999, pp. 227-230.

Joachim, C., et al., "Electronics using hybrid-molecular and mono-molecular devices", Nature, Nov. 30, 2000, vol. 408, pp. 541-548.

Cotton, F. Albert, et al., "Mononuclear Molybdenum (IV) Complexes with Two Multiply Bonded Chalcogen Ligands in Trans Configuration and Chelating Biphosphine Ligands", Inorg. Chem., 1997, vol. 36, pp. 2267-2278.

Cotton, F. Albert, et al., "Quadruply bonded dichromium complexes with bridging ∝-metalla-carboxylates", Inorganica Chimica Acta, 1997, vol. 254, pp. 233-238.

Akita, Munetaka, et al., "One-pot synthesis of transition metal-substituted carboxylic acids", Journal of Organometallic Chemistry, 1988, vol. 348, pp. 91-94.

Bauer, Rupert, et al., "On the Synthesis and Electrochemical Properties of Some New Bipyridinium and Related Compounds", Z. Naturforsch. 43b, 1988, pp. 475-482.

Cotton, F. Albert, et al., Multiple Bonds between Metal Atoms, 2nd edition, Clarendon: Oxford, 1993, ISBN 0-19-855649-7.

Cotton, F. Albert, et al., "Supramolecular Assemblies of Dimetal Complexes with Polydentate N-Donor Ligands: From a Discrete Pyramid to a 3D Channel Network", Inorganic Chemistry, 2002, vol. 41, pp. 2903-2908.

Balzani, V., et al., "Kunstliche molekulare Maschinen" (Artificial Molecular Machines), Angew. Chem., 2000, vol. 112, pp. 3484-3530.

Barkley, Jim V., et al., "Nucleophilic Addition to Complexes of $(Ph_2P)_2C=CH_2$ as a Route to Functionalized, Redox-Active Ruthenium(II)-Diphosphine Complexes", Inorg. Chem., 1997, vol. 36, pp. 6188-6196.

Allum, K. G., et al., "Supported Transitional Metal Complexes: III. Catalysts For the Hydrogenation of Olefins and Dienes", Journal of Organometallic Chemistry, 1976, vol. 107, pp. 393-405.

Kawashima, Toshihide, et al., "The Synthesis and Properties of a Methylviologen Analogue", Tetrahedron Letters, 1984, vol. 25, No. 15, pp. 1585-1586.

March, J., Advanced Organic Chemistry, 3. Auflage (Wiley, New York, 1985), pp. 595-613.

Stehle, Peter, et al., "Isotachophoresis of Quatemary 4,4'-Bipyridylium Salts: Analytical Control of Synthesis and Purification Procedures", Journal of Chromatography, 1988, vol. 449, pp. 299-305.

Blacker, John, et al., "1. Molecular Anion Binding and Substrate Photooxidation in Visible Light by 2,7-Diazapyrenium Cations", Helvetica Chimica Acta, 1987, vol. 70, pp. 1-12.

De Long, Hugh C., et al., "Ionic Interactions Play a Major Role in Determining the Electrochemical Behavior of Self-Assembling Viologen Monolayers", Langmuir, 1990, vol. 6, pp. 1319-1322.

Tang, Xiaoyan, et al., "A Vibrational Spectroscopic Study of the Structure of Electroactive Self-Assembled Monolayers of Viologen Derivatives", Langmuir, 1994, vol. 10, pp. 2235-2240.

De Long, Hugh C., et al., "Environmental Effects on Redox Potentials of Viologen Groups Embedded in Electroactive Self-Assembled Monolayers", Langmuir, 1992, vol. 8, pp. 2491-2496.

Gittins, David I., et al., "Diode-like electron transfer across nanostructured films containing a redox ligand", J. Mater. Chem., 2000, vol. 10, pp. 79-83.

Dehmlow, Eckehard V., et al., "Synthesen von hydroxylierten Bipyridinen, III[1]: Synthese von unsymmetrischen und symmetrischen Dihydroxybipyridinen (Syntheses of Hydrpxylated Bipyridines, III[1]: Synthesis of Unsymmetrically and Symmetrically Structured Dihydroxybipyridines)", Liebigs Ann. Chem., 1992, pp. 953-959.

Fischer, Hanspeter, et al., "Synthesis, Polarography and Herbicidal Activity of Quaternary Salts of 2-(4-Pyridyl)-1,3,5-Triazines, 5-(4-Pyridyl)pyrimidine, 2-(4-Pyridyl)pyrimidine and Related Compounds", J. Heterocycl. Chem., 1980, vol. 17, No. 2, pp. 333-336.

Turner, D. W., Molecular Photoelectron Spectroscopy, Wiley, London, 1970.

Dilworth, Jonathan R., et al., "The Synthesis of Molybdenum and Tungsten Dinitrogen Complexes", J. W. Inrog. Synth. 1980, vol. 20, pp. 119-127.

Anker, Maurice W., et al., "Preparation of Trichlorotris(tetrahydrofuran) molybdenum (III) and its Use in the Preparation of Complexes of Molybdenum-(III) and -(0)", J. Chem. Soc., Dalton Trans., 1975, vol. 23, pp. 2639-2645.

Lindner, Ekkehard, et al., "Supported organometallic complexes, Part XXIII. A general synthetic route for the synthesis of mono-T-silyl functionalized aromatic phosphines as ligands for chemistry in interphases", Journal of Organometallic Chemistry, 2001, vol. 628, pp. 151-154.

Erard, Jean-Francois, et al., "The Preparation of Mixed Organic Layers Chemically Bonded on Silcon Dioxide", Colloids and Surfaces, 1984, vol. 9, pp. 109-132.

De Croon, M. H. J. M., et al., "Kinetics and Mechanism of Cyclohexene Hydrogenation with Anchored Wilkinson Complex Comparison with the Behaviour of the Homogeneous Catalyst", Journal of Molecular Catalysis, 1981, vol. 11, pp. 301-311.

Ulman, A., "Formation and Structure of Self-Assembled Monolayers", Chem. Rev., 1996, vol. 96, pp. 1533-1554.

Abstract. Japanese Patent Application No. 9036389, "Switching Element and Its Manufacturing Method", Publication Date Feb. 7, 1997.

Gill, E.W., et al., The Synthesis and Characterisation of Some 2, 7-Diazaphenanthrene Derivatives, J. Heterocyclic Chem., 20, 1983, 1107-1109.

Cottom, Albert F., Basic Inorganic Chemistry, John Wiley & Sons, Inc., New York, 1976.

Imahori, H. et al.; "Porphyrin Monolayer-Modified Gold Clusters as Photoactive Materials"; Advanced Materials, Aug. 3, 2001, vol. 13, No. 15, ©Wiley-VCH Verlag GmbH, Weinheim, Germany, pp. 1197-1199.

Byrd, H. et al.; "Photocurrent generation in metal bisphosphonate multilayer thin films"; NATURE, vol. 380, Apr. 18, 1996, pp. 610-612.

Yamada, H. et al.; "Enhancement of Photocurrent Generation by ITO Electrodes of Modified Chemically with Self-Assembled Monolayers of Porphyrin-Fullerene Dyads"; Advanced Materials, Jun. 18, 2002, vol. 14, No. 12, ©Wiley-VCH Verlag GmbH, Weinheiim, Germany, pp. 892-895.

El-ghayoury, A. et al.; "Metallo-supramolecular oligo(*p*-phenylene vinylene)/[60] fullerence architectures: towards functional materials"; Elsevier, Thin Solid Films vol. 403-404, Feb. 1, 2002, pp. 97-101.

Metzger, R.; "Electrical Rectification by a Monolayer of hexadecylquinolinium Tricyanoquinodimthanide Sandwiched between Gold Electrodes"; Materials Research Society Symposium Proceedings, vol. 660, Nov. 27, 2000, ©2001 Materials Research Society, pp. JJ9801-JJ9806.

C. Elschenbroich and A. Salzer, Organometallchemie, (Organmetallic chemistry), 2nd Edition 1988, B.G. Teubner Verlag, Stuttgart, Germany, ISBN 3-519-13501-9 pp. 224-513. (English translation provided).

* cited by examiner

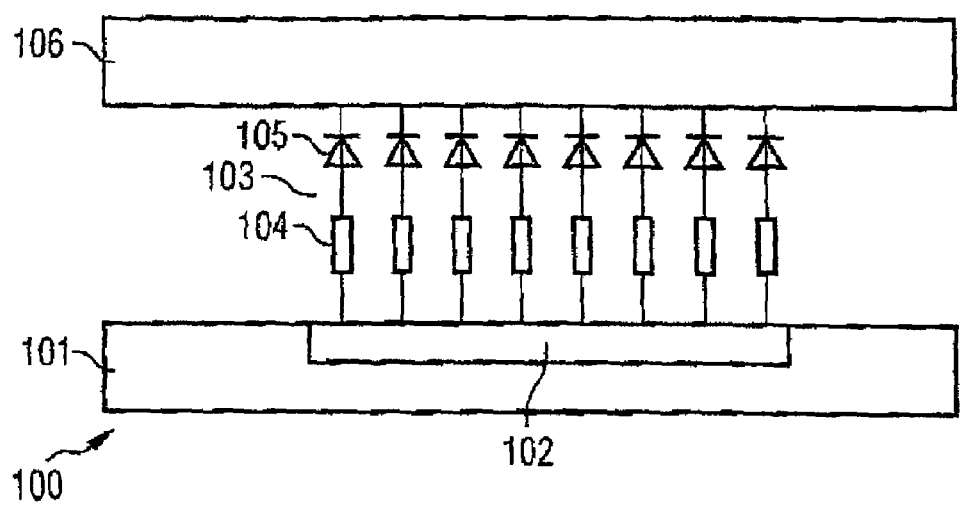
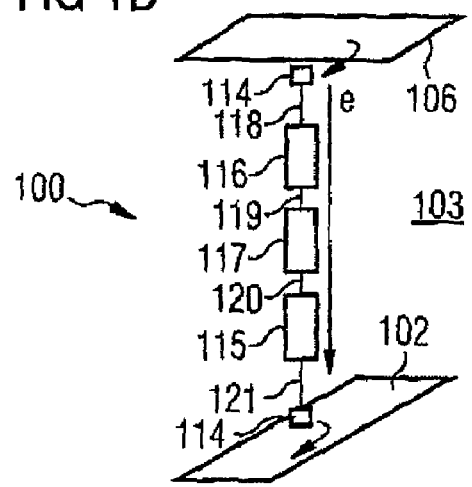
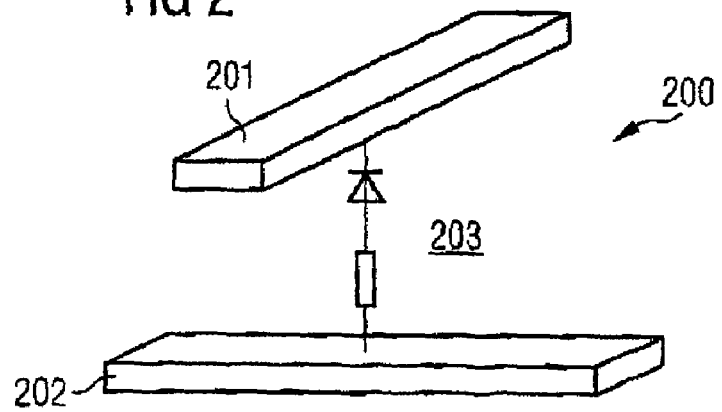

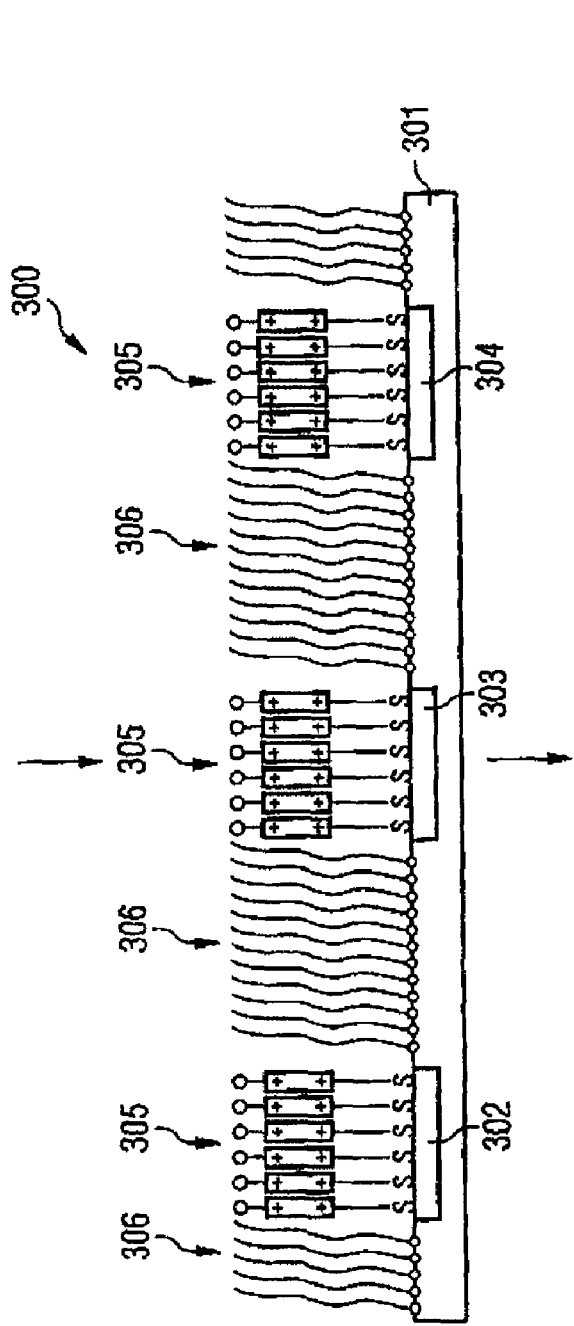
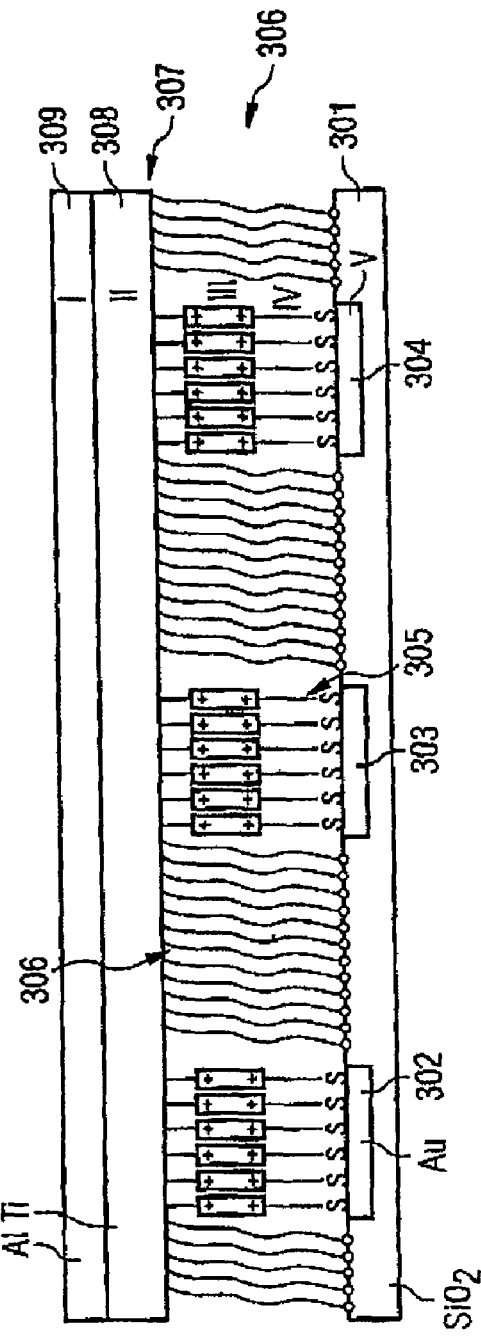

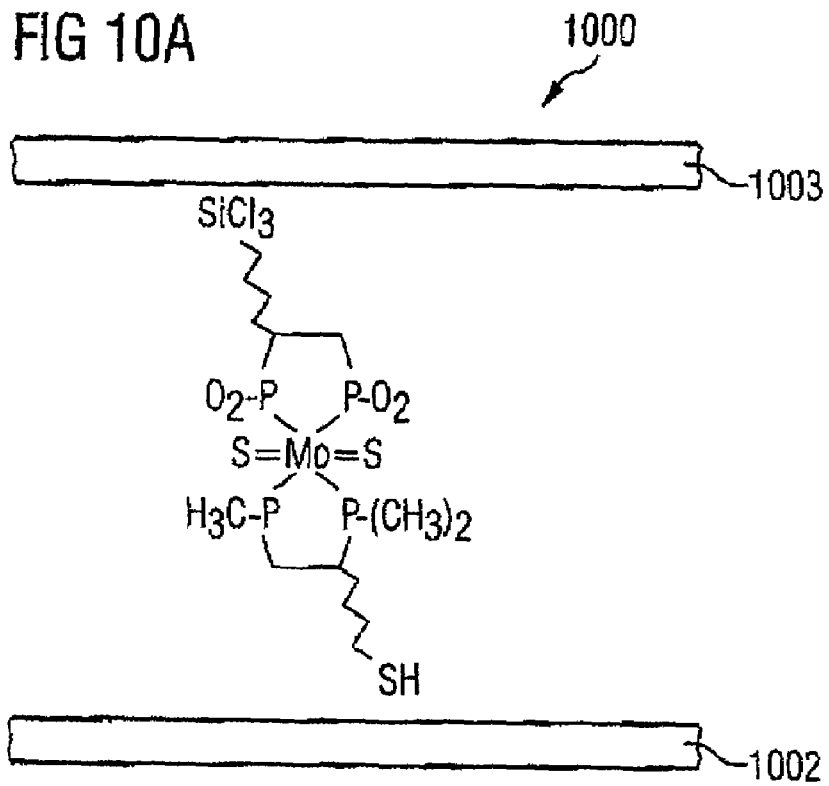
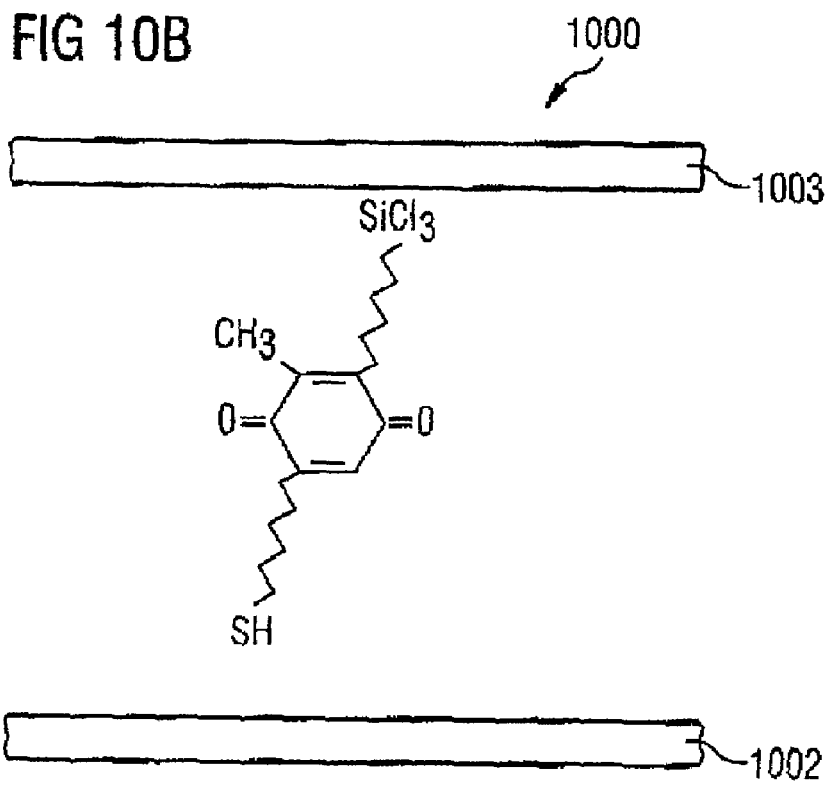

FIG 11
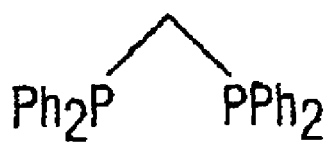 Diphenylphosphinomethane (dppm)
 Diphenylphosphinoethane (dppe)
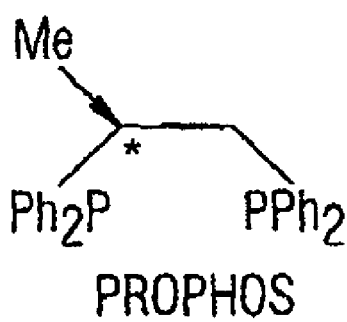 2-methyldiphenylphosphinoethane
PROPHOS
 Dimethylphosphinoethane (dmpe)

2,7 diazaphenantherene 2,7 diazapyrene

Tetrahydrodiazapyrene

CIRCUIT ELEMENT HAVING A FIRST LAYER OF AN ELECTRICALLY INSULATING SUBSTRATE MATERIAL AND METHOD FOR MANUFACTURING A CIRCUIT ELEMENT

CROSS-REFERENCE TO RELATED APPLICATION

This application claims priority to German Patent Application Serial No. 103 24 388.7, filed May 28, 2003.

FIELD OF THE INVENTION

The invention relates to a circuit element having a first layer composed of an electrically insulating substrate material, and to a method for production of a circuit element.

BACKGROUND OF THE INVENTION

Conventional microelectronics, which are based on silicon components such as CMOS chips (complementary metal oxide semiconductor chips) are reaching their limits, even with the further progress in miniaturization. Molecular electronics are being discussed as one of the possible ways for further component miniaturization.

In addition to the general problem of developing circuit elements with the aid of molecular electronics, a further aspect that is considered in this context is the development of alternatives to the previous semiconductor memory elements such as DRAMs (dynamic random access memories), SRAMs (static random access memories) or flash memories.

It is known from C. P. Collier et al., Electronically configurable molecular-based logic gates, Science, Vol. 285, pages 391-394, 1999, that configurable circuit elements which can be used to construct logic gates can be obtained with the aid of monomolecular layers based on rotaxanes. This is based on the fact that the monomolecular layers of the rotaxanes can be changed, that is to say switched, from a conductive state to a less conductive state by application of a voltage. However, this switching process that is known from C. P. Collier et al. is irreversible, and is thus suitable only for a write once/read multiple application.

It is known from C. P. Collier et al., A Catenane-based solid state electronically reconfigurable switch, Science, Vol. 289, pages 1172-1175, 2000, that a reversible switching process can be achieved with the aid of a further specific molecule class, the so-called catenanes. However, considerably weaker signals are observed with this switching process.

The two circuit elements that are known from C. P. Collier et al., Electronically configurable molecular-based logic gates, Science, Vol. 285, pages 391-394, 1999, and C. P. Collier et al., A Catenane-based solid state electronically reconfigurable switch, Science, Vol. 289, pages 1172-1175, 2000, have even further disadvantages for widespread practical application, however. On the one hand rotaxanes and catenanes can be obtained only by complex synthesis processes. On the other hand, Langmuir-Blodgett methods are used to produce the monomolecular layers for both circuit elements. Furthermore, the suitability of these Langmuir-Blodgett methods for the coating of surfaces of components such as silicon wafers, which are normally used to produce electrical components, is still uncertain.

In addition to the approaches discussed above for development of circuit elements based on organic molecule layers, it is known from D. I. Gittins et al., A nanometre-scale electronic switch consisting of a metal cluster and redox-addressable groups, Nature, Vol. 408, pages 67-69, 2000, that an electrical switch can be produced by the specific combination of a molecule with a bispyridinium unit and a nanoparticle (metal cluster) composed of gold. Since nanotechnology is still in its infancy, it is questionable whether this system can still be used for a practicable application for the foreseeable future.

Further developments in the field of molecular electronics are described in M. A. Reed et al., Prospects for molecular-scale devices, IEEE, Tech. Digest, pages 227-230, 1999. Inter alia M. A. Reed et al. describes a circuit element based on a specific substituted 4,4'-di(phenylene-ethynylene)-benzothiolate, which bears an ethyl group as a substituent at the 3-position in the phenylene unit. A temperature-dependent conformational change, specifically a rotation of the central phenylene unit, in this circuit element results in an abrupt change in the conductivity at 20 K. Another phenylene-ethynylene-benzothiolate which is substituted at the 4-position in the central phenylene unit with a nitroamine group which is used as the redox center, can be used in a memory element, according to M. A. Reed et al.

However, practical use of these circuit elements is described in M. A. Reed et al. as not being certain. The benzothiolates discussed in M. A. Reed et al. are referred to in C. Joachim et al., Electronics using hybrid-molecular and mono-molecular devices, Nature, 408, pages 541-548, 2000, only as being promising for memory elements.

DE 199 59 904 C2 discloses a method and an apparatus for controlling an electrical current by means of biomolecules.

DE 101 32 640 A1 discloses a molecular electronics arrangement having two interconnects which can be provided at a defined distance from one another by using a spacer, and in which case a molecular electronic molecule can be applied between the two interconnects.

WO 03/041182 A2 discloses a molecular electronic component for the construction of nanoelectronic circuits, a molecular electronic module, and an electronic circuit.

WO 02/071139 A1 discloses an electrochemical pixel apparatus with an electrochemical transistor and an electrochromic element.

WO 02/049124 A2 discloses a molecular architecture for a molecular electrooptical transistor.

WO 96/007487 A1 discloses a method for synthesis of materials with controllable electronic, magnetic and/or optical characteristics.

U.S. Pat. No. 6,212,093 B1 discloses a high-density, non-volatile memory apparatus with a sandwich structure.

SUMMARY OF THE INVENTION

The invention is based on the problem of providing alternative electrical circuit elements, as well as a method for manufacturing them.

A circuit element such as this is a circuit element having a first layer composed of an electrically insulating substrate material,
 - having a first electrically conductive material which is in the form of at least one discrete area, such that it is embedded in the substrate material and/or is applied to the substrate material,
 - a second layer having a second electrically conductive material, and
 - a monomolecular layer composed of molecules which can transport charge carriers, wherein a) the monomolecular layer composed of the molecules (referred to below also as electrically active molecules) which can transport charge carriers is arranged between the first layer composed of electrically the insulating substrate material and the second layer having the second electrically conductive material, b) the monomolecular layer on the first electrically conductive material, which is in the form of at least one discrete area, is immobilized, and wherein c) the monomolecular layer having the second electrical material makes electrical contact with the second layer, wherein each molecule which can transport charge carriers in the monomolecular layer has a) at least one redox-active unit, and b) at least one first unit, which is used as an electron donor, and c) at least one second unit, which is used as an electron acceptor, and wherein d) the redox-active unit in each molecule is in each case arranged between the unit which is used as an electron donor and the unit which is used as an electron acceptor.

In plain words, the invention is based on the principle of forming a variable resistance and a diode in a molecule which can transport charge carriers (that is to say which can transport electrons or holes), that is to say at the molecular level, such that, figuratively the diode and the resistance are arranged in series (in this context, see, for example, FIGS. 1 and 2). In this case, the variable resistance is in the present case formed by the redox-active unit of the individual molecules. The diode function is created in the molecule by the asymmetric arrangement of an electron donor, that is to say a group or unit of the molecule with electron-donating characteristics, and an electron acceptor, that is to say a group or a unit of the molecule. An arrangement of the donor and/or acceptor group in the molecule such as this has the effect that a component of the dipole vector exists which is at right angles to the two electrode surfaces. This leads to the formation of the diode function.

The configuration of the molecules which can transport charge as a variable resistance and a diode connected in series, as is possible for the present circuit element, firstly has the advantage that larger arrays of the circuit elements are possible for given parasitic disturbances, in particular parameter fluctuations. Secondly, the integration of the diode and resistance in a single molecule (structure) allows miniaturization, thus making it possible to produce large-scale integrated electrical memories.

In the present invention, charge may be transported both by electrons (n conductors) and by holes (p conductors), that is to say the charge transport in the molecules that are used for this purpose is not restricted, for example, to electrons. In order to explain this, the mechanism of charge transport based on the band model (which comprises "electron conduction" and "hole conduction") is transposed to a molecular orbital model. In this case, it is assumed for this purpose that the HOMO is the highest orbital in the valency band of the molecule, and that the LUMO is the lowest orbital in the conductance band.

If an electron is now injected into the LUMO, this excess electron can be transported along the LUMO through the molecule or molecules. Subsequent electrons are transported in the same way. This mechanism corresponds to negative conduction. The molecule is reduced in order to initiate the conduction mechanism.

An oxidation mechanism can be formulated in an analogous manner. This is widely used in organic electrochemistry, and is achieved by extracting an electron from the HOMO and producing a "hole". This "hole", which corresponds to a missing electron, can then itself migrate. In reality, the holes are always filled by electrons, and, formally, in a corresponding manner to the band model, "a hole", that is to say a positive charge, migrates.

A unit which is used as an electron donor, and which is also referred to in the following text as a donor or donor group, is in the present case defined as an electron-rich molecule group or a single atom which, for example, is in the form of a substituent in the basic structure of the active molecules that are used here, with this group or this atom having an electron-donating effect. This effect may either be an inductive effect, that is to say the so-called +I effect and/or a mesomer effect, that is to say the so-called +M effect. Examples of molecule groups with an +I effect are, for example, alkyl groups such as methyl, ethyl, tertiary butyl, aryl groups such as benzyl, naphthyl, or aryl alkyl groups such as phenyl, which may be either substituted or unsubstituted. In the case of substituted donor groups, this has an electron-pushing effect overall, and all the substituents preferably have an electron-donating effect (for example aryl groups). However, it is also possible for individual substituents on their own to have an electron-attracting effect (as will be explained in the following text) as long as this results in an electron-donating effect, overall. Atoms or molecule groups which provide free electron pairs and allow the formation of mesomer boundary structures have a +M effect. Examples of substituents such as these include —OH, —OR, —NH$_2$, —NHR, —SR, or the higher homologs of these groupings, that is to say the corresponding groups of arsenic (As), antimony (Sb), selenium and tellurium, as well as the halogens fluorine, chlorine, bromine and iodine. In this case, fluorine is preferred as an electron-donating substituent in particular for organic redox-active units/molecule groups since, owing to the radius of its atom in bonds with carbon atoms, the +M effect is dominant over the I effect which results from the electro negativity difference, with respect to carbon (bonds).

Further donor groups for the purposes of the invention include, for example, donors, which bear redox-active or redox-inactive metal centers, such as phthalocyaninyl groups (Cu, Zn, Al—Cl, etc.) or ferrocenyl groups (substituted and unsubstituted). The substitution of metal complex fragments in the α position leads to a considerable increase in the donor effect. For example, this increases the pk$_s$ value of acetic acid from about 5 to 7-8. (F. A. Cotton and Schmid, G., Quadruply bonded dichromium complexes with bridging metalla-carboxylates, Inorganica Chimica Acta, 254, 1997, pages 233-238, M. Akita, N. Kakinuma and Y. Moro-oka, J. Organomet. Chem. 1988, 348, 91 and the references cited therein).

Further examples of donor groups such as these are electron-rich, heteroaromatic compounds such as furan, thiophene, pyrrole, oxazole, isothiazole, etc. and their derivatives, and polyenes with appropriate suitable substituents (see also FIG. 8).

A unit which is used as an electron acceptor, and which is also referred to in the following text as an acceptor or an acceptor group is, for the purposes of the present invention, a molecule group or an atom which has an electron-attracting effect when the unit or the atom is applied, for example, as a substituent to the basic molecule structure. In consequence, a unit such as this is a group with a −I and/or a −M effect (for example —CN, —NO$_2$, —CHO, —CO—, —COOH, —COO$^-$, —COSH, —COS$^-$, —SO$_3$H) or atoms such as the halogens. By way of example, chlorine or bromine are preferred as halogens for use as the acceptor group, since their electron-attracting −I effect is generally greater than their +M effect.

Further acceptor units which can be used in the present invention are electron-depleted (hetero) aromatic groups such as pyrylium, pyrone, pyrimidinium, in substituted and unsubstituted form. Furthermore, it is also possible to use acceptor groups for the purposes of the invention having redox-active and redox-inactive metal centers, such as cobaltocenium, ferrocenium, highly fluorinated phthalocyaninyl groups (with Cu, Zn or Al as the central metal atom, with the latter having chloride as a further ligand), or compounds containing boron, such as difluoroborates. Fluoroborates such as these have, for example, the following basic structure and can be obtained by conversion of the corresponding acetylacetonates with $BF_3$ etherates.

At this point, it should be noted that, for the purposes of the invention, the expressions donor and acceptor unit are always regarded as being relative, that is to say a comparison to one another. The essential feature for the formation of the diode function for the purposes of the invention is that the unit which is used as the electron acceptor is more electronegative overall (in the sense of a greater electron-attracting effect) than the unit which is used as the electron donor. The magnitude of the difference in the electron-donating/attracting units is responsible for the diode characteristic. This means that it is also possible to use two molecule groups, which both, for example, exert a +I effect but whose magnitude is different, as the donor group and acceptor group, provided that this results in a satisfactory diode characteristic. However, in one refinement of the invention, it is preferable to use donor groups and acceptor groups with opposite effects, for example −I and +I.

In this case, a redox-active unit is defined as a chemical grouping, molecule group or else an individual atom which can absorb and emit electrons reversibly, that is to say in chemical terms, their or its oxidation state can be changed by reduction and oxidation. This unit thus has at least two atom or molecule states, whose redox activity can be described by the equation $M_1 + x.e^- \rightleftharpoons M_1^{x.e-}$.

In principle, any known inorganic or organic redox system may be used in the circuit element disclosed here.

In one refinement of the circuit element, the redox-active unit has exclusively one organic basic structure, that is to say this redox-active unit comprises only carbon, nitrogen, oxygen atoms, etc. One example of a redox unit such as this is, for example, the bispyridinium unit illustrated in FIG. 9 and included in formula (I). This redox system comprises a double positively charged cation and a single positively charged radical cation. This redox process can be described by the reaction equation $bipy^{2+} + e^- \rightleftharpoons bipy^{\cdot+}$. During the redox process in the bispyridinium unit or group, which is also known by the abbreviation "bipy", the double positively charged cation represents the electrically nonconductive species. The single positively charged radical cation is electrically conductive, owing to the free electron.

Another example of a redox-active unit which is based on an organic basic structure is represented by quinoid systems such as ring-substituted quinones or thionaphtoquinones (which bear at least one "anchor group" as a substituent for immobilization of the molecules on the conductive material in the first discrete area), (see FIG. 10B).

In the redox-active units which are based on an organic basic structure, a unit which is used as an electron donor and/or a unit which is used as an electron acceptor are/is preferably bonded as substituents to different atoms in the organic basic structure of the redox-active unit.

In one preferred form of this refinement of the present circuit element, the redox-active unit is a bispyridinium unit. In this case, one of the two pyridine rings has at least one electron-attracting substituent such as —$NO_2$, —CN, —CHO, —COOH or a metal-organic acceptor or electron-pushing substituents, while the other (second) pyridine ring is unsubstituted or has substituents which act as electron acceptor relative to the substituents in the first pyridine ring. This always results in asymmetry along the bispyridinium unit (which matches the concept of the present invention as described above of arranging the electron donor and the electron acceptor such that a component of the dipole vector exists which is at right angles to the two electrode surfaces), and this is responsible for the diode function. The strength of the electron-attracting or pushing substituents also influences the location of the switching potential. It should be noted here that different electrode materials (different work functions) can be used to produce a diode characteristic, even if both pyridine rings are symmetrically substituted. The synthesis of differently substituted bispyridine substrates is described, for example, in R. Bauer, P. Nussbaumer, M. Neumann-Spallart, "On the Synthesis and Electrochemical Properties of Some New Bipyridinium and Related Compounds, Z. Naturforsch. 43*b*, pages 475-482, 1988.

In this context, it should be noted that, in the event of substitution of one or both pyridine rings in the bispyridinium unit by a donor and/or an acceptor group, the redox-active unit is, strictly speaking, not arranged between the unit which is used as the electron donor and the unit which is used as the electron acceptor, but is arranged between the center of symmetry of the (unsubstituted) "bipy" unit. Thus, in general, the expression "the redox-active unit is arranged between the electron donor and acceptor" includes, in the sense of the invention, the idea of the center of symmetry of the (unsubstituted) redox-active unit being arranged between these two units. A further example, in which the expression is used in the same sense, is substituted quinoid redox systems. At the same time, these are also an example of acceptor/donor-substituted redox systems.

In another preferred refinement, the redox-active unit of the electrically active molecule has a metal center. In this case, the metal center may be either an individual metal atom or a multinuclear metal center.

As already discussed, charge transport takes place either via the HOMO or via the LUMO. Depending on whether a metal character or a ligand character can in fact be ascribed to these limiting orbitals, the charge which occurs is in fact localized on the metal or on the ligand. The phosphine compounds (which will also be discussed later) of the $MoX_2(P—P)$ type; X=S, Se, Te, P—P=diphenylphosphinoethene (dppe), bis(diphenylphosphino)ethene (dppee) [see F. A. Cotton and G. Schmid, G., Monomolecular Molybdenum (IV) complexes with multiply bonded chalcogen ligands in trans configuration and chelating bisphosphine ligands, Inorg. Chem. 36, 1997, pages 2267-2278] represent an obvious example of this. The free electron pairs on the chalcogen atoms correspond to the HOMO of these molecules. The LUMO has a metal-d-orbital character. Thus, to a first approximation, a hole remains on the ligand and an electron on the metal.

Any metal complex (a metal complex which is asymmetric for diode functions) which can be reversibly reduced and/or oxidized at least once is thus suitable for the application disclosed here. From the structural point of view octahedral or pentagonal pyramid coordinated metal complexes are preferred for a refinement relating to this in the present invention. Examples of this are phosphine or amine complexes of metals such as molybdenum, rhenium or ruthenium, which are likewise listed further below.

All metals are suitable as metal centers, in particular those in the transition metal series, lanthanides and actinides. The elements in the first transition series (V, Cr, Mn, Fe, Co, Ni) have a particularly rich redox chemistry. Innumerable compounds are described, for example, in F. A. Cotton, G. Wilkinson Anorganische Chemie, [Inorganic Chemistry] Verlag Chemie, ISBN-3-527-25903-1", first transition series, pages 703-838, second and third transition series 839-998, lanthanides 999-1022, or C. Elschenbroich and A. Salzer, Organometallchemie, [Organometallic chemistry] 2nd Edition 1988, B. G. Teubner Verlag, Stuttgart, Germany, ISBN 3-519-13501-9 pages 224-513. The provision of linker groups for these metal complexes, which in the present case are used for immobilization of the molecules by means of anchor groups on the first (or else on the second electrically conductive area of the circuit element according to the invention is prior art.

Particularly preferable redox pairs in one embodiment are $Fe^{2+}/Fe^{3+}$, $Cu^+/Cu^{2+}$.

Innumerable examples of metal complexes with two metal atoms which are directly bonded to one another can be found in Cotton, F. A. ; Walton, R. A. Multiple Bonds Between Metal Atoms, 2nd ed.; Clarendon: Oxford, 1993, ISBN 0-19-855649-7, Re: 28-119; Mo: 139-230; W: 232-242; Mo/W: 242-243; Cr: 258-297; triple bonded W, Mo: 303-391; Rh: 431-488; Co, Ir, Ni, Pd, Pt: 502-526; higher nuclearity Re, Mo, W: 533-607. The metals Mo, Rh, and Ru are particularly preferable in this series.

When using this material class, that is to say metal complexes (clusters, multinuclear complexes), the layer deposition process, as described further below, in order to form a circuit element according to the invention, can be carried out sequentially. In this case, the metal complex need not be synthesized completely before a deposition process, but is formed during a process sequence. This is illustrated by the following example: an ω pyridylthiol is immobilized on a gold substrate by means of the conventional gold/sulfur coupling. The self-organized monolayer has accessible pyridyl end groups on which dirhodium tetratrifluoroacetate complexes can be coordinated axially. For this purpose, the complex is brought into contact with the ω pyridylthiol in solution. The active monolayer formed in this way is rinsed and is provided with a top electrode (see also F. A. Cotton, et al. "Supramolecular Assemblies of Dimetal Complexes with Polydentate N-Donor Ligands: From a Discrete Pyramid to a 3D Channel Network", Inorg. Chem. 2002, 41, pages 2903-2908).

The metal center which is used in the invention preferably has at least one metal which is preferably chosen from the group which comprises actinides, lanthanides, the elements in the first transition group of the periodic table (PTE), elements in the fourth transition group of the PTE, elements in the sixth transition group of the PTE, elements in the seventh transition group of the PTE, and elements in the eighth transition group of the PTE.

Of the elements copper, silver and gold in the first transition group of the periodic table, copper compounds are preferred in this case, since copper forms the (stable) redox system $Cu^{2+}+e^- \leftrightarrows Cu^+$. Examples of redox units which are based on this redox system are copper phthalocyanine or copper complexes with phenanthroline ligands (in this context, for example, see compound [53] from Balzani V. et al. Künstliche molekulare Maschinen [Synthetic molecular machines], Applied Chemistry 2000, 112, pages 3484-3530).

Preferred elements in the sixth transition group of the PTE are chromium and molybdenum. In the case of chromium, the redox system comprising $Cr^{2+}-e^- \leftrightarrows Cr^{3+}$ is preferred. By way of example, mononuclear molybdenum complexes with double multiply bonded chalcogen ligands and chelating bisphosphine ligands may be used as a molybdenum compound, as described in F. A. Cotton and G. Schmid, G., Monomolecular Molybdenum (IV) complexes with multiply bonded chalcogen ligands in trans configuration and chelating bisphosphine ligands, Inorg. Chem. 36, 1997, pages 2267-2278 and as available on the basis of the synthesis that is disclosed there. One example of chromium compounds such as these is binuclear chromium complexes with bridging α-metallacarboxylates as ligands, as are described in F. A. Cotton and Schmid, G., Quadruply bonded dichromium complexes with bridging metallacarboxylates, Inorganica Chimica Acta, 254, 1997, pages 233-238. Manganese is preferred from the elements in the seventh transition group. One example of manganese compounds is the manganese acetate complex $(Mn_{12}O_{12}(CH_3COO)_{16}(H_2O)_4$ which is described in C. Joachim et al.

Preferred elements in the eighth transition group of the PTE are Fe, Co, Ru, Rh and Ir. Examples of basic structures (compounds), which may be used as redox-active units are, for example, complexes of iron, with carboxylic acid anions, such as acetate. Other examples are, for example, ferrocene $(C_5H_5)_2Fe$, which can be oxidized to form $(C_5H_5)_2Fe+$ (see C. Elschenbroich and A. Salzer, Organometallchemie, [Organometallic chemistry] 2nd Edition 1988, B. G. Teubner Verlag, Stuttgart, Germany, ISBN 3-519-13501-9, page 308), as well as ferrocene derivatives, which bear suitable donor or acceptor groups such as $NH_2$ or COOH on at least one of the aromatic ring systems (for example $(C_5H_5)$ $FeC_5H_5NH_2$) and for example, as described in C. Elschenbroich and A. Salzer on pages 385, 386. Suitable Ir, Ru or Co compounds are, in particular, phosphine or amine complexes, which can be formed by means of basic structures or ligands which are known, for example, from numerous publications in conjunction with hydrogenating or polymerizing catalysts (see, for example, U.S. Pat. Nos. 4,134,906, 3,907,852, and 4,965,234). Diphenylphosphinoethane (dppe), bis(diphenylphosphino)ethane (dppee) or 2-methyldiphenylphosphinoethane (see FIG. 11) and the corresponding phosphite derivatives (in which the phosphorus bears one or two oxygen atoms) should be mentioned here (see FIGS. 10 and 11) as examples of ligands which can be substituted by donor or acceptor groups. Rutheniumbis (diphenylphosphino)ethane-chloro complexes and their nucleophile addition products such as ruthenium(aminopropylamino)bis(diphenylphosphino)ethane-chloro complexes Barkely, J. et al., Nucleophilic Addition to Complexes of (Ph2P) 2C:CH2 as a route to functionalized redox-active Ruthenium(II)-Diphosphine Complexes, Inorganic Chemistry, 1997, 36(27), pages 6188-6196) or diphenylphosphinoethyltriethoxysilane complexes of ruthenium or iridium Allum K., et al. Supported transition metal complexes III. Catalysts for the hydrogenation of olefins and dienes, J. Organmet. Chem. (1976), 107(3), pages 393-405) may be cited as examples of complexes based on ligands such as these. One embodiment of the invention is preferably to use a metal complex with the general formula (III)

$$M_x(PP-LINK)_yL_z,$$

where M is a metal atom which is selected from the actinides, lanthanides, the elements in the first transition group of the periodic table (PTE), elements in the fourth transition group of the PTE, elements in the sixth transition group of the PTE, elements in the seventh transition group of the PTE and elements in the eighth transition group of the PTE of the group, PP represents a chelating phosphine or phosphine oxide, LINK represents a linker for immobilization on the surface of the electrically conductive material and L represents a ligand for completion of the coordination sphere of the complex, and with the number of coordination points x+2y+z being in the range from 4-8, preferably between 4 and 6. In preferred compounds based on the formula III, the metal center is selected from Fe, Co, Ni, Mn, Cr, Mo, Ru, Rh or Cu. Examples of ligand atoms L for completion of the coordination sphere are S, Se or Te (see above). In the notation used in the formula (III), π-bonded ligands L such as cyclopentadienyl ligands have only one coordination point. Examples of linkers (linker groups) are alkyl groups with 1 to 20 carbon atoms, as defined in the chemically inert compounds based on the formula (II) described further below and which have an anchor group which is likewise described in the following text in conjunction with the electrically inert molecules (for example SH, $SiCl_3$, $NH_2$, COOH or alkoxysilanes, for example —$SiR_n(OR')_{3-n}$, with R and R' alkyl, R' normally methyl or ethyl, n=0-2).

In this case, it should be noted that the basic structures or compounds mentioned above and based on metal coordination complexes can be used in asymmetric form in order to form the diode character, by using different electron donors and different acceptors (see FIG. 10a).

As is evident, for example, on the basis of the formula III, it is in general furthermore also possible to use all metals which can form redox systems with stable bivalent metal ions. One example of this is nickel, which, for example in the form of decamethylnickelocene $(C_5Me_5)_2Ni$ can be converted in a stable manner to form single-positively charged, or double-positively charged cations $(C_5Me_5)_2Ni^+$ and $(C_5Me_5)_2Ni^{2+}$, respectively. Another example is diacetyldioxime nickel complexes.

Suitable substituents or other immobilized molecules and/or suitable counterions ensure the charge equalization which is required in the case of redox systems due to the change in the redox state. Examples of this are the hydroxide anion ($OH^-$), the anions of the halides, in particular $Br^-$ and $Cl^-$, anions of organic acids such as acetate or complex anions such as the $PF_6^-$ anion, or other complex anions such as the anions of strong acids such as $NO_3^-$, $ClO_4^-$, or $SO_4^{2-}$. Further examples of suitable anions are complex anions such as $BF_4^-$, $CF_3SO_3^-$ (triflate), $B(Ph)_4^-$ or complex metal anions such as $[PtCl_4]^{2-}$.

On the basis of the compounds which have been mentioned above, it can be seen that, in the preferred embodiments of the circuit element disclosed here, the redox-active unit may be an organometallic compound or an inorganic coordination compound (an inorganic metal complex such as a cluster or multinuclear complex). It can likewise be seen that in the compounds which are used by preference, the metal atom, or the metal atoms, in the case of a multinuclear complex, is or are arranged in the center of the complex and thus of the redox-active unit.

Furthermore, it is at the same time clear, on the basis of the examples, that the at least one group which is used as the electron donor and as the electron acceptor may be complexing ligands (which are directly bonded to the metal center) of the metal center, if a metal center is used as the redox-active center. In this case chelating ligands such as phosphines, phosphites, acetylacetonato, oximato, acetato, sulfido, nitrilo, or amino represent a preferred embodiment.

In a further embodiment, the redox-active metal center is bonded to an essentially planar macrocyclic, polydentate ligand, which has a conjugate Π electron system. In this case, the macrocyclic polydentate ligand is preferably phthalocyanine, naphthalocyanine, or tetrazaphorphyrin. In this embodiment, copper is preferably used as the metal center.

Finally, it is also evident from the examples described above that the redox-active unit may be covalently or coordinatively bonded to the molecule structure of the electrically active molecules. It follows from this that a molecule which is used for charge carrier transportation here must not only have groups which are covalently bonded to one another but, that it is also possible for individual groups to be present such as redox-active units via non-covalent interactions in the molecule (structure).

The molecules which can transport charge carriers are immobilized via an anchor group on the at least one area composed of the first electrically conductive material. In principle, any functional group which can enter into a non-covalent (for example coordinative) or a covalent bond, with the surface of the electrically conductive material may be used for this fixing. In consequence, the immobilization may be achieved by physical or chemical interactions.

These interactions include hydrophobic or ionic (electrostatic) interactions and covalent bonds. For example, when using thiol groups as a substituent and gold as the conductive material which is applied to the substrate material, the immobilization can be achieved by the so-called gold/sulfur coupling.

A covalent bond can be achieved by means of any suitable bonding chemistry. The choice of the respective head group can also be influenced by the nature of the electrically conductive material. For example, if the conductive material is gold, thiols are particularly suitable for use as anchor groups; if palladium is used, for example, cyanides (nitrites) and isocyanides (isonitriles) may be used as the preferred head groups.

In one embodiment of the circuit element, a covalent or coordinatively directed bond of the redox-active compounds to the first conductive material is preferred, because this makes it possible to ensure the orientation of the molecules and the (electrical) contact with the conductive materials. If desired, immobilization can also be achieved by means of covalent or non-covalent bonds to the second electrically conductive material as well.

Examples of anchor groups which are suitable for immobilization are —SH, —COOH, —$CONH_2$, —COSH, —OCN, —NCO, —CN, —S—SH, —$NR_2$, —$PR_2$, —$SiR_xCl_{3-x}$, (where x=0,1,2) where R represents any desired suitable substituents, preferably hydrogen, alkyl, aryl or arylalkyl. More complex polydentate organic or inorganic ligands such as acetylacetonato, oximato, acetato, sulfido, nitrilo or amino, which may include a coordinative bond, for example with metal atoms, may be used as anchor or head groups. Furthermore (hetero) aromatic ring systems, which have atoms with the capability of coordinative bonding (that is to say atoms with free electron pairs) in the ring are also suitable for use as anchor groups. Aromatic anchor groups such as these include, for example, furan, thiophene, pyrrole, oxazole, thiazole, imidazole, isoxazole, isothiazole, pyrazole, benzo[b]furan, benzo[b]thiophene, indole, 2H-isoindole, benzothiazole, pyridine, pyrazine, pyrimidine, α-pyrone, γ-pyrone, quinolone, isoquinoline as well as bipyridine and derivatives of them, which are shown in FIG. 7.

In this case, there may be any desired substituents R in the ring systems although these are not shown, for the sake of clarity, in FIG. 7.

The anchor groups mentioned above preferably require the formation of self-organizing layers composed of the electrically active molecules, and lead to the molecules being aligned with one another.

Furthermore, connecting units (spacers or linker groups) may be provided in the electrically active molecules, connecting the other molecule units such as the redox-active unit and the anchor groups, to one another. Linker groups such as these are, for example, linear saturated (that is to say not conjugate) alkyl units or conjugate direct electron conductors and hole conductors. One example of a hole conductor such as this is a thiophene chain, and one example of an electron conductor is the following naphthalenetetracarboxylic acid diimide unit:

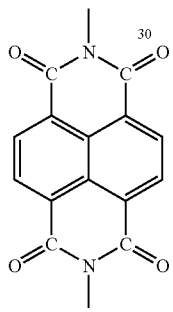

In the case of naphthalene compounds such as these, the bonding is via the diimide unit; a naphthalenetetracarboxylic acid diimide unit such as this can be obtained by reaction of a naphthalenetetracarboxylic acid dianhydride with a corresponding amine.

Furthermore, the linker groups may also have substituents or groups which, for example, influence the diode characteristic of the electrically active molecules. It is thus possible, for example, to use polyoxyalkylene chains as linker groups, in which the oxygen atoms produce an electron-donating effect. By the use of two different linkers, for example a polyoxyalkylene linker on "the one side of the molecule" considered from the redox unit as the (symmetry) center, and a polyester linker whose OCO groups exert an electron-attracting effect, the diode characteristics of the electrically active molecules can be further influenced or controlled.

However, in the present case, it is also possible for these linker groups not to be present and for individual units to be directly linked to one another or occur in a common molecule group. In one preferred refinement, the donor and acceptor groups are linked directly to the redox-active unit. Another possibility is, for example, the anchor groups at the same time also to be a component of a donor and/or acceptor group.

At this point, it should be stressed that not only a single unit from the acceptor/donor group and a redox-active unit arranged in between may occur in the electrically active molecules. In fact, it is also possible for two or more of these units to be present in a sequential sequence in one electrically active molecule.

At this point, it shall be noted that the diode function of the electrically active molecules in the invention can also be achieved by the following approaches, to be precise on their own or in conjunction with the configuration of the electrically active molecules described here.

On the one hand, it is possible to use two electrodes with different work functions in order to make contact with the functional molecular layer. This results in a Schottky barrier being produced. For example, gold may thus be used as the first electrically conductive material and titanium or aluminum as the second conductive material.

One of the conductive materials can be modified by application of a tunnel barrier in its Fermi level. Thus, for example, a native oxide can be modified by deliberate application of an additional layer, for example, of a metal layer in this way.

In one development of the circuit element, electrically inert modules on the at least one discrete area composed of the first electrically conductive material are additionally immobilized. These electrically inert molecules, such as alkyl thiols or alkyl amines, may be used to "dilute" the active molecules, if this is desired. In this case, the electrically active molecules may be distributed both isotropically and anisotropically. It is thus possible for a circuit element according to the invention to be formed by only a single electrically active molecule.

In another advantageous development of the circuit element, electrically inert molecules on the first layer composed of the electrically insulating substrate material are immobilized, and form a matrix which surrounds the at least one discrete area with the monomolecular layer composed of redox-active molecules.

An electrically inert molecule is in this case a chemical compound which is used as an electrical insulator and is preferably also chemically inert, in particular being resistant to oxidation or reduction, so that it does not interfere with the circuit and/or write/read processes which are carried out by the electrically active molecules. Owing to their characteristic of being used as electrical isolators, the layers form an isolating matrix from the inert molecules, which may in the following text also be referred to as isolator molecules, in order to electrically isolate the individually active areas (positions) in the circuit element from one another.

In principle, any types of molecule which satisfy the requirements mentioned above may be used in the circuit element according to the invention. In this case, it is also possible to use different types of inert molecules in order to form an isolating matrix.

In one preferred embodiment of the circuit element, the electrically inert molecules are compounds with a long chain (saturated) alkyl radical.

The electrical molecules preferably have a head group, by means of which they can be bonded to the first layer, which is composed of the electrically insulating substrate material. In this case immobilization is possible via non-covalent or covalent bonds. The inert molecules can also be immobilized on the layer which is formed from the second electrically conductive material.

The inert matrix-forming molecules are preferably alkylsilyl compounds with the general formula:

where, in the formula (II), p represents an integer between 1 and 30, preferably between 1 and 20, and in which case the inert molecules on the first layer may be immobilized via at least one of the radicals $R_1$, $R_2$ and $R_3$, which, independently of one another, may be hydrogen, halogen, OR', NHR', NR'R", where R' and R" is alkyl (typically methyl, ethyl, propyl, butyl, etc., n is preferably 0-5, particularly preferably n=0-2). Compounds such as these are commercially available, for example from ABCR/Gelest (simpler compounds are also available from Fluka or Aldrich). These compounds are particularly preferred when a substrate based on silicon is used. In this case, covalent bonding of the inert isolator molecules takes place via free hydroxy groups on the surface of the substrate material.

At this point, it should be noted that the length of the alkyl chains of the electrically inert molecules depends on the respective compound that is selected for charge transport. It is advantageous for the length of the inert molecules and of the "active" compounds which are selected for charge transport to be approximately the same, in order in this way to achieve monomolecular layers of approximately the same thickness. The number of alkyl units in the isolating tail group of the inert isolator molecules can be estimated on the basis of the known bond lengths. However, a purely empirical procedure can also be used to determine the most suitable molecule length.

In consequence, the use of electrically inert molecules with a long chain alkyl radical, in particular of alkylsilyl compounds as in the formula (II) in circuit elements is a further subject of the invention.

In one refinement, the circuit element disclosed here is an element in which a large number of discrete areas composed of the first electrically conductive material are embedded in the substrate material and/or are applied to the substrate material. This refinement makes it possible, for example, for the circuit element according to the invention to be in the form of an electrical memory with a large number of memory cells.

In one preferred refinement of the circuit element, the first electrically conductive material is gold, silver, palladium, platinum or silicon. The discrete area which the first conductive material occupies may be in the form of an electrode in the substrate material.

In another refinement of the circuit element disclosed here, the layer composed of the second electrically conductive material has titanium, aluminum, and/or the materials of the first electrically conductive layer. The second layer may likewise be in the form of an electrode.

In one preferred embodiment, the circuit element described here is arranged between two electrodes. These electrodes may be the first and the second electrically conductive material. In this refinement, that is to say for an arrangement between two electrodes, the circuit element according to the present invention represents a variable resistance and, in consequence, a memory element, by virtue of the redox-active unit.

In one development, in which a large number of individual layers are used with the electrically active molecules, an arrangement of such memory elements forms a memory matrix, that is to say it can be used as an electrical memory. One advantage of this refinement is the use of a molecular dipole network as the memory element, which reduces the wiring complexity, and increases the packing density, in comparison to conventional memory elements, such as RAMs. The memory element according to the invention thus offers access to a large-scale integrable electrical memory. The memory element is preferably a permanent memory element and the electrical memory which is based on a large number of memory elements is preferably a permanent memory. A permanent memory such as this may be used, for example, as a memory for graphics information, for example as a memory for "on-chip" video films.

In one preferred embodiment, the molecules which can transport electrons are bispyridinium molecule compounds with the general formula (I)

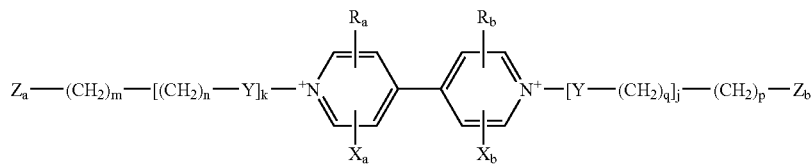

where, in the formula (I)
one or more of the carbon atoms in the two aromatic ring systems of the bispyridinium unit may be replaced independently of one another by (at least) one grouping $X_a$ or $X_b$, which each represent a heteroatom which is selected from S, N and O, or represent a blank space (that is to say as a result of which a 5-membered ring is produced), one or more of the carbon atoms of the two ring systems may in each case, independently of one another, have a respective substituent $R_a$ or $R_b$ which, in each case independently, represents alkyl, aryl, alkylaryl, alkenyl, alkynyl, halogen, CN, OCN, NCO, COOH, COOR', CONHR', $NO_2$, OH, OR', $NH_2$, NHR', NR'R'', SH and SR' while, independently of one another, R' and R'' may be alkyl, aryl, alkylaryl, alkenyl or alkynyl, in which case, $R_a$ and $R_b$ may together form a bridge to form a link between the two aromatic ring systems, comprising 1 to 3 atoms, in which case the atoms may be selected independently of one another from C, S, N and O and may be linked to one another by a single, double or triple bond and, furthermore, may have one or more mutually different substituents $R_c$ where the substituent $R_c$ has the meaning as indicated above for $R_a$ and $R_b$, Y represents a group which, independently of one another may be selected from $CH_2$, O, S, NH, NR', COO, CONH, CH=CH, C≡C or aryl, $Z_a$ and $Z_b$ may in each case, independently of one another be $CH_3$, —CH=$CH_2$, SH, —S—S—, —S(CO)—$CH_3$, $SiCl_3$, $Si(OR)_3$, $SiR(OR')(OR'')$, $SiR(OR')_2$, $Si(R'R'')$ $NH_2$, COOH, $SO_3$, $PO_3H$ or $NH_2$, where R' and R'' may in each case independently of one another be alkyl, aryl, arylalkyl, alkenyl or alkynyl, where n, q may in each case independently of one another assume a value between 0 and 12, j and k may in each case independently of one another assume a value between 0 and 6, and p and m may in each case independently of one another assume a value between 0 and 12.

$R_a$ and $R_b$ are not identical in the two ring systems (in order to produce the desired asymmetry in the electrically active molecules) if the diode function of the molecules based on the formula (I) is not produced by different electrode materials or by different anchor groups.

Compounds based on the formula (I) are preferably used in the circuit element according to the invention, in which the chain which is bonded to the nitrogen atom of the respective ring in each case has no more than a total of 20 atoms. In this case, once again compounds are preferred in which the two chains overall together have an overall length of more than 30 atoms. Expressed with the aid of indices, this means that (j·q+p) and (k·n+m) may preferably, in each case independently of one another, assume a value (integer) not greater than 20. The sum of (j·q+p)+(k·n+m) is thus in this case preferably not greater than 30. For the sake of clarity, it should be stressed that the group Z is ignored in this analysis of the chain length of the two substituents which are bonded to the N atoms (see the detailed definition of Z which follows further below).

Since the bispyridinium compounds which are used here are generally in cationic form, the bispyridinium compounds are used in the form of their suitable salts. The hydroxide anion (OH⁻), the anions of the halides, in particular Br⁻ and Cl⁻, anions of organic acids such as acetate or complex anions such as the $PF_6^-$ anion or other complex anions such as the anions of strong acids such as $NO_3^-$, $ClO_4^-$ or $SO_4^{2-}$ may, for example, be used as counter ions. Further examples of suitable anions are complex anions such as $BF_4^-$, $CF_3SO_3^-$ (triflate), $B(Ph)_4^-$ or complex metal anions such as $[PtCl_4]^{2-}$.

Alkyl groups may be substituted or unsubstituted in the compounds described here based on the formula (I) or (II) in linear form or with branches. This is also true when they occur in other groups, for example, in alkoxy, alkylmercapto, alkoxycarbonyl groups. Alkyl groups with 1 to 12 carbon atoms are preferred and alkyl groups with 1 to 8 carbon atoms are particularly preferable, particularly in compounds based on the formula (I). The expression alkyl also covers cycloalkyl groups with 3 to 8 ring carbon atoms, which may likewise be substituted or unsubstituted.

Alkenyl and alkynyl groups in the compounds based on the formula (I) or (II) may likewise be linear or have branches, or be substituted or unsubstituted. This is true even when they occur in other groups, for example alkoxy, alkylmercapto, alkoxycarbonyl groups. Alkenyl or alkynyl groups with 2 to 12 carbon atoms are preferred and alkenyl or alkynyl groups with 2 to 8 carbon atoms are particularly preferred, especially in the compounds based on the formula (I). The expression alkenyl furthermore covers cycloalkenyl groups with 3 to 8 ring carbon atoms, which may likewise be substituted or unsubstituted.

One preferred substituent of the alkyl, alkenyl or alkynyl groups in this case is halogen, that is to say fluorine, chlorine, bromine or iodine, with fluorine being particularly preferred.

If $R_a$ and $R_b$ together form a link between the two ring systems of the compounds based on the formula (I), it shall be stressed at this point that, in this case, an HC=CH group represents a preferred alkenyl group, which preferably forms a link between the ring atoms 2 and 9 and/or 4 and 5. Fused aromatic systems such as 2,7-diazaphenanthrene (in the case of only one link) or 2,7-diazapyrenium (in the case of two links) thus belong to the bispyridinium basic structures that are used by preference in this case (see FIG. 12). (Fused) heterocyclic compounds derived from them may equally well be used in the present invention (see the definition of $R_a$ and $R_b$). A further example of a bispyridinium basic structure in which the substituents $R_a$ and $R_b$ form a link is the tetrahydrodiazapyrene (see FIG. 12) which is known from Kawashima et al., The synthesis and properties of a methylviologen analogue, Tetrahedron Letters, Vol. 25, No. 25, pages 1585-1586, 1984. For the sake of clarity, it should be stated that systems such as these may, of course, furthermore have a substituent $R_c$, as is evident from the definition of formula I. In one embodiment, $R_c$ is preferably halogen, with fluorine once again being preferred.

The meaning of aryl in the compounds based on the formula (I) includes substituted and unsubstituted carbocyclic aromatic groups such as phenyl, naphthyl, anthracyl as well as heterocyclic aromatic groups such as N-imidazolyl, 2-imidazolyl, 2-thienyl, 3-thienyl, 2-furanyl, 3-furanyl, 2-pyridyl, 3-pyridyl, 4-pyridyl, 2-pyrimidyl, 4-pyrimidyl, 2-pyranyl, 3-pyranyl, 4-pyranyl, 3-pyrazolyl, 4-pyrazolyl, 5-pyrazolyl, 2-pyrazinyl, 2-thiazolyl, 4-thiazolyl, 5-thiazolyl, 2-oxazolyl, 4-oxazolyl and 5-oxazolyl. Ar likewise contains fused polycyclic aromatic ring systems such as quinoline or 9H-thioxanthene-10,10-dioxide, in which a carbocyclic aromatic ring is fused with one or more heterocyclic rings.

The representation of bispyridinium compounds in the formula (I) is preferably carried out in steps, by first of all synthesizing the bispyridine unit, then carrying out the quarternization at the nitrogen atom. In this case, unsubstituted bispyridines can be prepared by analogy with the biphenyls, for example by means of the Ullmann coupling (C—C bonding of aryl halides with copper) or Wurtz's synthesis (step-by-step conversion with copper, which allows the formation of asymmetric compounds); in this context, see, for example J. March, Advanced Organic Chemistry, 3rd edition (Wiley, New York, 1985), page 597 et seq., pages 597 et seq., and the cited references mentioned there. Unsubstituted bispyridine is commercially available.

The bonding of the N substituents to the bispyridinium unit is carried out simply by quarternization with R—X. For the simplest case, for example, by conversion of bipyridyl with reactants such as methyl iodide in benzene (see for example P. Stehle et al. Isotachophoresis of quarternary 4,4'-Bipyridylium Salts -Analytical Control of synthesis and purification procedures, J. Chromatogr. 449(1), 299-305, 1988, or Blacker et al., Molecular anion binding and substrate photooxidation in visible light by 2,7 diazapyrenium cations, Helvetica Chimica Acta, 70, pages 1-12, 1987). This then directly results in the symmetrically N-substituted bispyridinium compounds, or, if a suitable radical X is used, also results in steps in asymmetric compounds (the choice of X in this case controls the solubility in suitable solvents), and is followed by the exchange of opposing ions and substitution of the second N atoms. In general this can be formulated as follows:

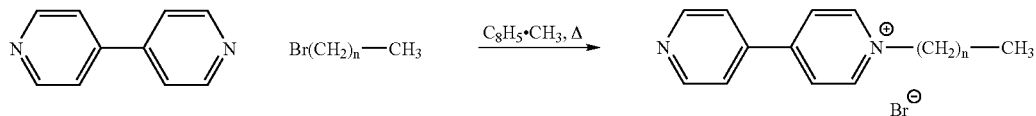

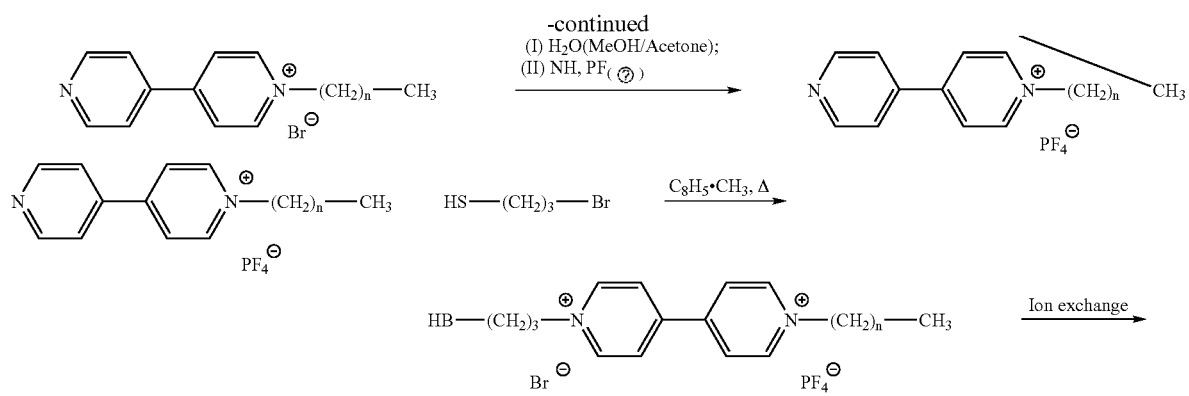

⑦ indicates text missing or illegible when filed

The substitution for the nitrogen atoms, which leads to asymmetric compounds, may be carried out for example, in a two-step reaction, as described in H. C. DeLong & D. A. Buttry, Ionic Interactions play a major role in determining the electrochemical behaviour of self-assembling viologen monolayers, Langmuir, 6, pages 1319-1322, 1990, on the basis of the synthesis of N-(n-decyl)-N'-(10-mercaptododecyl)-4,4'-bispyridinium (in this context, see also X. Tang et al., A vibrational spectroscopic study of the structure of electroactive self-assembled monolayers of viologen derivatives; Langmuir, 10, pages 2235-2240, 1994, or H. C. DeLong & D. A. Buttry, Environmental Effects on redox potential of viologen groups in electroactive self-assembling viologen monolayers, Langmuir, 8, pages 2491-2496, 1992, as well as D. I. Gittins et al., Diode-like electron transfer across nanostructured films containing a redox ligand, J. Mater. Chem., vol. 10, pages 79-83, 2000).

The substitution for the bispyridinium unit by $R_a$ and $R_b$, in which these may both be substituents with electron-donating and electron-attracting characteristics, may be carried out as a previous reaction, for example as described in R. Bauer et al., E. V. Dehmlow & A. Sleegers, Synthesen von hydroxilierten Bipyridinen, III: Synthese von unsymmetrischen und symmetrischen Dihydroxybipyridinen [Synthesis of hydroxylated Bipyridines, III: Synthesis of asymmetrical and symmetrical Dihydroxybipyridines], Liebigs Ann. Chem. 9, pages 953-959, 1992, or H. Fischer & A. L. Summers, Synthesis, polarography and herbicidal activity of quaternary salts of 2 (4 pyridyl)-1,3,5-triazines, 5-(4 pyridyl)pyrimidine, 2 (4 pyridyl)pyrimidine and related compounds, J. Heterocycl. Chem. 17(2), pages 333-336, 1980 (see, in particular R. Bauer et al., schemes 1 and 2; E. V. Dehmlow & A. Sleegers, compounds 6). On the basis of a bispyridinium compound, which bears a hydroxyl group in the 2 position (see R2 in E. V. Dehmlow & A. Sleegers) it is also, for example, possible, to obtain an —S—S— or —S— linked system by conversion with $P_2S_5$ with ring formation (see the definition of $R_a$ and $R_b$). Furthermore, and in particular when using 2,7-diazaphenanthrene as the bispyridinium unit, the introduction of the substituents $R_a$ and $R_b$ may be carried out analogously to the method described in E. W. Gill & A. W. Bracher, The synthesis and characterisation of some diazaphenanthrene derivatives, J. Heterocyclic Chem. 20, pages 1107-1109, 1983 (see there, in particular, compounds 6 and 7).

Compounds with (additional) heteroatoms, that is to say one or more groups X, may, for example, be obtained by means of the synthesis process described in H. Fischer & A. L. Summers (see block 4 and 5 there).

In the compounds based on the formula (I), the group X may be used in the same way as the substituents R as well to influence and to deliberately control the electrochemical characteristics, that is to say in particular the redox potentials, of the bispyridinium unit. Substitutions such as these make it possible to assist the charge equalization during a switching process in the circuit element.

It is thus possible, for example, by means of electron-rich substituents R such as alkyl or aryl radicals, which exert an inductive, electron-donating effect (the so-called +I effect), to simplify the electron emission by the bispyridinium unit, and thus to reduce the reduction potential. The same applies to substituents which produce free electron pairs and allow the formation of mesomeric boundary structures, which exhibit a +M effect. Examples of substituents such as these are —OH, —OR, —$NH_2$, —NHR, —SR or fluorine.

Opposite effects, that is to say an increase in the oxidation potential, can be achieved by substituents with electron-attracting -I and -M effects (for example —CN, —$NO_2$, —COOH, —$SO_3H$) or with substituents such as Cl, in which an electron-attracting effect outweighs an electron-donating effect.

These effects shall be derivable and should provide a good match, for example with trends and knowledge from photoelectron spectroscopy (see, for example D. W. Turner, Molecular Photoelectron Spectroscopy, Wiley, London, 1970). For substituted benzenes, for example, the ionization potential is known from this document, and is correlated with the energy of the highest occupied molecular orbital (HOMO). +I and +M substituents have higher-energy HOMOs than benzene, that is to say lower ionization potentials (corresponding to the fact that they can be oxidized more easily) and this effect is reversed in the case of -M and -I substituents. This influence on the ionization potentials is admittedly not quite as strong, but also clearly exists. This relationship applies in particular because the electrophilic aromatic substitution with the influence of +M/+I substituents which accelerate the reaction, takes place via a primary reaction of the aromatic electron system with $E^+$, that is to say it corresponds to oxidation of the aromatic compound.

The substituents Y can likewise be used to influence the electrochemical characteristics of the bispyridinium compounds used here in the manner described above for the substituents R and X.

One preferred class of bispyridinium compounds is molecules with long-chain alkyl radicals. These compounds have the advantage that they allow the formation of self-organizing layers of the redox-active molecules on the surface of the electrically conductive material with compounds such as these, j and k, in the formula (I) assuming the value 0.

In one embodiment, molecules in which the (alkyl) chains located on the pyridine nitrogen atom have a length of 6 to 12 atoms are preferred in the present invention. However, it is also possible to use shorter or longer chains, provided that the redox characteristics of the bispyridinium molecules and the functionality of the circuit element are not adversely affected by this.

The letter Z in the formula (I) represents a head or anchor group, by means of which the bispyridinium compounds are applied to the electrically conductive materials. This immobilization can be carried out by means of physical or chemical interactions.

These interactions include hydrophobic or ionic (electrostatic) interactions and covalent bonds. For example, when using thiol groups as the substituent and gold as the conductive material, which is applied to the substrate material, the immobilization can be carried out by so-called gold/sulfur coupling.

When using groups such as SH, $SiCl_3$ or $NH_2$, COOH the bispyridinium compound can be directly covalently bonded with the electrically conductive material. In this case it is also possible to use disulfide compounds (RSSR', where R =R'=a molecule containing bipyridyl, and R=a molecule containing bipyridyl, and R' simply being methyl or short alkyl), which likewise form monolayers on gold, although this is done by means of noncovalent interactions. It is also possible, for example when free hydroxyl groups can be formed on the surface of the electrically conductive material (for example when using doped silicon) to use alkoxysilanes for the bonding, for example —$SiR_n(OR')_{3-n}$ with R and R' alkyl, R' typically methyl or ethyl, n=0-2.

The covalent bonding may in this case be carried out by means of any suitable bonding chemistry. However, it is also possible to use a short separate linker for immobilization of the redox-active compounds.

At this point, it should be stated that the selection of the respective head group can also be influenced by the nature of the electrically conductive material, independently of the nature of the "active" molecule (inorganic metal complex such as phosphine compounds or bispyridinium compounds). For example, if the conductive material is gold, thiols are particularly suitable for use as anchor groups; when using palladium, cyanides (nitrites) and isocyanides (isonitriles) may be used as preferred head groups, while silylchlorides, silylamines Si(R'R")$NH_2$ as well as, as stated above, alkoxysilanes, —$SiR'_n(OR'')_{3-n}$ with R' and R"=alkyl, (typically methyl, ethyl, propyl, butyl, etc., n preferably=0-5, and particularly preferably n=0-2) are particularly highly suitable anchor groups for immobilization for silicon surfaces.

Another head group which is generally highly suitable for immobilization and is thus likewise preferred is —S(CO)—$CH_3$.

The present invention thus also relates to bispyridinium compounds with the general formula (I) in the definition as stated above.

The invention furthermore relates to the use of bispyridinium compounds with the general formula (I) as a functional component of (electrical) memory units, in particular as a functional component of permanent memories.

In general, any compound having one or more bispyridinium units and which can reversibly assume the two oxidation states described here may be used as a functional unit in a circuit element as described here.

In the case of the method according to the invention for production of a circuit element a layer composed of an insulating substrate material is used. A first electrically conductive material is then embedded in the substrate material and/or is applied to the substrate material at at least one discrete position.

After this, electrically conductive molecules which can transport charge carriers are immobilized as a monomolecular layer on the at least one discrete area composed of the first electrically conductive material, with each molecule in the monomolecular layer which can transport electrons having: a) a redox-active unit, b) at least one first unit, which is used as an electron donor, and c) at least one second unit, which is used as an electron acceptor, and with the redox-active unit in each molecule being arranged between the unit which is used as the electron donor and the unit which is used as the electron acceptor.

A second layer having a second electrically conductive material is then applied to the layer having the redox-active molecules, as a result of which the molecules which can transport charge carriers in the monomolecular layer come into contact with the second electrical material in the second layer.

In a development of the method, after the immobilization of the molecules which can transport charge carriers, electrically inert molecules on the first layer composed of the electrically insulating substrate material are immobilized. The electrically inert molecules thus form a matrix, which surrounds the at least one area with the monomolecular layer having the redox-active molecules.

In one preferred embodiment, the electrically active molecules are also immobilized on the second electrically conductive material, in order to ensure the electrical contact with this material. This immobilization may be carried out by means of an identical anchor group in the same manner as the immobilization on the first conductive material.

Compounds with a long-chain alkyl radical, in particular compounds based on the formula (II), are preferably used as electrically inert molecules.

Gold is preferably used as the first conductive material. Furthermore, the first electrically conductive material is preferably embedded in and/or applied to the substrate material in a regular arrangement.

The layer composed of the second electrical material is preferably applied in such a way that the second electrical material is vapor-deposited on to the layer composed of the electrically active molecules and the inert molecules.

In a further refinement of the method, titanium and/or aluminum is used as the second electrically conductive material.

BRIEF DESCRIPTION OF THE DRAWINGS

Exemplary embodiments of the invention will be explained in more detail in the following text and are illustrated in the figures in which:

FIGS. 1a and 1b show a symbolic illustration of the function of the electrically active molecules including their configuration as a (monomolecular) layer in a circuit element according to the invention (FIG. 1a), and a schematic configuration of the electrically active molecules (FIG. 1b);

FIG. 2 shows a schematic functional illustration of a so-called "crosspoint" cell, in which the layer that is used here that is composed of the electrically active molecules is located at the crossing point between a word line and a bit line;

FIGS. 3a to 3e show an exemplary embodiment of the method described here for production of a circuit element;

FIGS. 10a and 10b show further compounds, which can be used as electrically active molecules in the invention;

FIG. 11 shows examples of phosphine ligands, which can be used in the electrically active metal complex compounds that are used here, such as Co, Mo or Ru complexes.

DETAILED DESCRIPTION OF THE PREFERRED MODE OF THE INVENTION

Figure 3A:
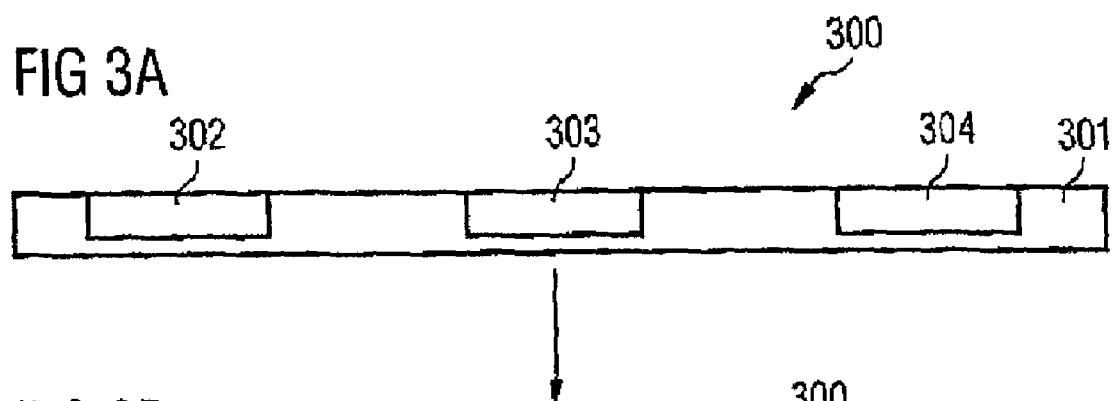

FIG. 1a shows a symbolic illustration of the function of the electrically active molecules, including their configuration as a (monomolecular) layer in a circuit element according to the invention.

The circuit element 100 (a detail of which is shown here) has the substrate material 101, in which at least one discrete area 102 composed of the first electrically conductive material is arranged. The substrate material is an insulator material such as silicon oxide or silicon nitride. The discrete area 102 is composed of gold.

Molecules 103 which can transport charge carriers are immobilized on the discrete area. These molecules form a (programmable) resistance 104 as well as a diode 105, which are arranged in series. The layer composed of the molecules 103 makes contact with a second layer 106 composed of a second electrically conductive material molecules 103 which can transport charge carriers. The second layer 106 is likewise composed of gold.

FIG. 1b shows a further detail of the circuit element 100 and a refinement of the electrically active molecules 103. These molecules are in each case immobilized by an anchor group 114 on the first conductive material 102 and on the second layer 106. In both cases, the anchor group is a thiol group. The molecules 103 have a unit 115 which acts as an electron donor, as well as a unit 116 which is used as an electron acceptor, and a redox-active unit 117 arranged in between them. The individual units are connected to one another via "spacer areas" 118, 119, 120 and 121. The electrons, which are symbolized by the arrow 122, enter the molecule on the layer 106, which acts as a cathode, and emerge from the molecule 103 via the discrete area 102, which acts as an anode.

In this case, the cathode is that point at which electrons enter the molecule, and emerge from corresponding holes. The anode is in consequence the point at which opposing processes take place, that is to say the electrons and the holes enter the molecule.

FIG. 2 shows a schematic functional illustration of a so-called "crosspoint" cell 200, in which the layer which is used here and is composed of the electrically active molecules 203 is located at the crossing point between the word line 201 and the bit line 202.

FIG. 3 shows an example of the method described here for production of a circuit element 300.

Figure 3B:
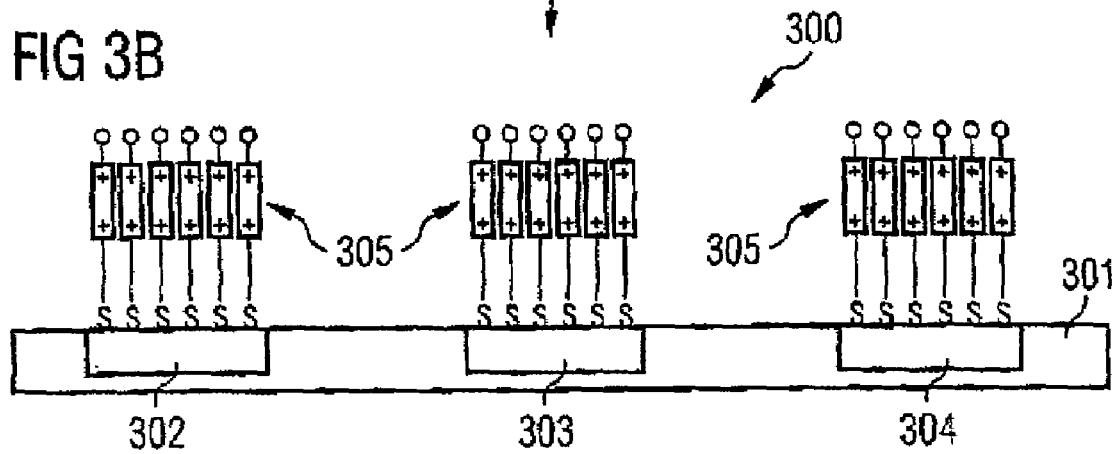

FIG. 3a shows the substrate material 301, in which discrete areas 302, 303, 304 composed of the first electrically conductive material are arranged. The substrate material is an insulator material, such as silicon oxide or silicon nitride. The discrete areas 302, 303, 304 are composed of gold.

A compound 305 which can transport charge carriers is then immobilized on the areas 302, 303, 304 (FIGS. 3b and 3c), with a monomolecular layer composed of the molecules of the compound 305 being formed on each of these areas. The compound 305 is the monocore molybdenum complex shown in FIG. 10, with two chalcogen ligands and chelating bisphosphine ligands, which is synthesized as follows.

First of all, the molybdenum dinitrogen complexes $Mo(N_2)_2(PP)_2$ are produced from the corresponding phosphines, based on Dilworth, J. R., Richards, R. L.; Chen. J. J.; McDonald, J. W. Inorg. Synth. (1980), 20, 119, or Anker, M. W.; Chatt. J.; Leigh, G. J., Wedd, A. G.; J. Chem. Soc., Dalton Trans. (1975) 23, 2639. The corresponding dinitrogen complex is then reacted with dibenzyl trisulfide in toluene under mild conditions to form the molybdenum dichalcogen complex (F. A. Cotton and G. Schmid, G., Monomolecular Molybdenum (IV) complexes with multiply bonded chalcogen ligands in trans configuration and chelating bisphosphine ligands, Inorg. Chem. 36, 1997, pages 2267-2278). These synthesis processes work independently of phosphine ligands, even with non-chelating substitution products.

The introduction of substituents into phosphines which are suitable for bonding to surfaces may be carried out in the case of silicon as an anchor group, for example as described in Lindner, E. et al. Supported Organometallic complexes Part XXIII: A general synthetic route for the synthesis of mono-T-silyl functionalized aromatic phosphins as ligands for chemistry in interphases, Journal of Organometallic Chemistry (2001), 628 (2), pages 151-154, or Erard, J. F. The preparation of mixed organic layers chemically bonded on silicon dioxide, Colloidal. Surf. (1984), 9 (2), pages 109-132, or DeCroon, M. J. M. H. & Coenen, J. W. E.: Kinetics and mechanism of cyclohexene hydrogenation with anchored Wilkinson complex: Comparison with the behaviour of the homogenous catalyst, J. Mol. Cat. (1981) 11 (2-3), pages 301-311. If sulfur is used as the anchor group for immobilization, the synthesis process can be carried out as described in U.S. Pat. No. 3,842,108.

Figure 3C:
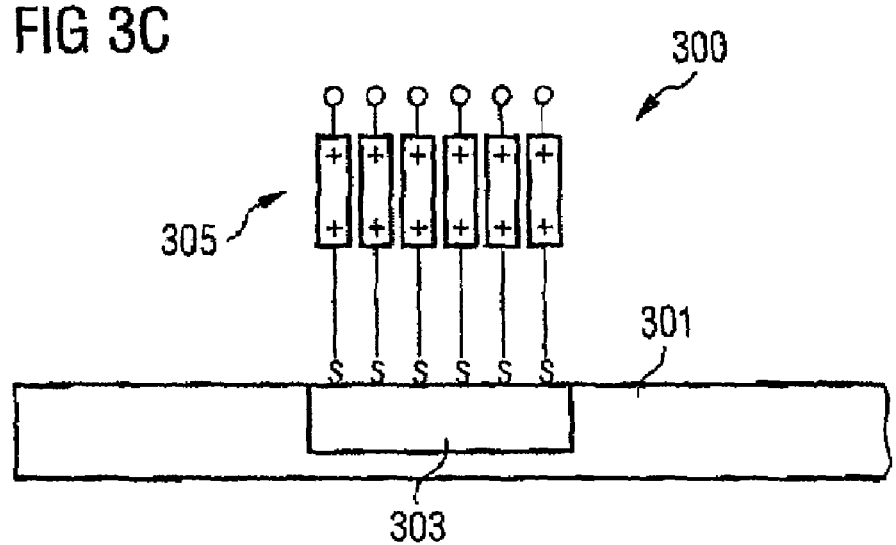

The immobilization on the gold surfaces at the areas 302, 304, 304 is carried out via gold/sulfur coupling (see the detailed view in FIG. 3c). The compound to be immobilized is normally for this purpose dissolved in an organic solvent such as hexane or ethanol (depending on the solubility) in a concentration of 10 to 100 mM, and is brought into contact with the substrate surface. The adsorption then normally takes place in a time period of 30 minutes to about 12 hours (overnight) at room temperature. The surface is then carefully rinsed with solvent. The substrates which have thus been provided with the monomolecular layers can be stored while in air and in solvent (provided that the temperature is not too high). A. Ulman, Formation and Structure of Self-Assembled Monolayers, Chem. Rev., vol 96 (4), 1533-1554 (1996) offers an overview of the immobilization methods which can be used here.

Electrically inert molecules 306 on the layer of the substrate material 301 as the monomolecular layer are then immobilized (FIG. 3d). In this case, trichloroalkylsilanes or alkoxysilanes with an alkyl chain length of about 10 to 30, preferably with up to about 20 carbon atoms, are used as the molecules 306. The immobilization is carried out via covalent bonds of the silicon atom to hydroxyl groups on the surface of the silicon dioxide which is used as the substrate material 301.

In the next step, the second electrically conductive layer 307 of the circuit element is formed (FIG. 3e). For this purpose, a layer 308 composed of titanium is first of all vapor-deposited onto the monomolecular layers of the compound 305 (in this case of the molybdenum complex 305) and of the insulator molecules 306, in a vacuum. A further layer 309 composed of aluminum is then vapor-deposited in a vacuum. In principle, all methods which allow protective deposition of the metal layer can be used for application of the second electrical layer.

The diode function which is provided by the phosphine ligands of the molecule 305 is in this refinement influenced by the modification of the Fermi level of the second electrical layer. This makes it possible to form a circuit element with two or more molecular resistances which may be used, for example, as a memory element.

Figure 4A:
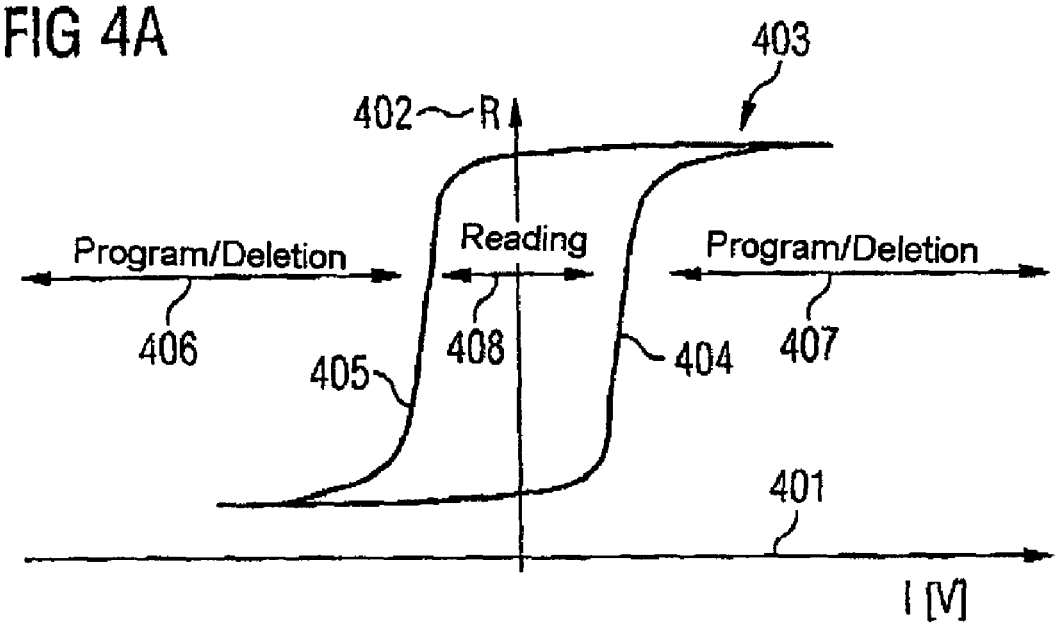
FIGS. 4a to 4c show a schematic illustration of the characteristic of a programmable resistance, as is produced here in the circuit element according to the invention, with a read and programming/deletion area (FIG. 4a), as well as the schematic method of operation, which will be explained with reference to the bispyridinium redox system (FIGS. 4b and 4c)

FIG. 4a shows, in the form of a schematic illustration, the characteristic of a programmable resistance, as is produced in the circuit element according to the invention, with its reading and programming and deletion area. The graph shows the resistance 402 of this characteristic 403 as a function of the voltage 401. The resistance 402 has hysteresis (see the characteristics 404 and 405) and changes its value when a specific positive or negative voltage is applied to the electrically active molecules. Values which are greater than this voltage level allow the circuit element to be programmed (written to) or deleted (areas 406 and 407). The circuit element is read within the range 408 of small potential changes.

Figure 4B:
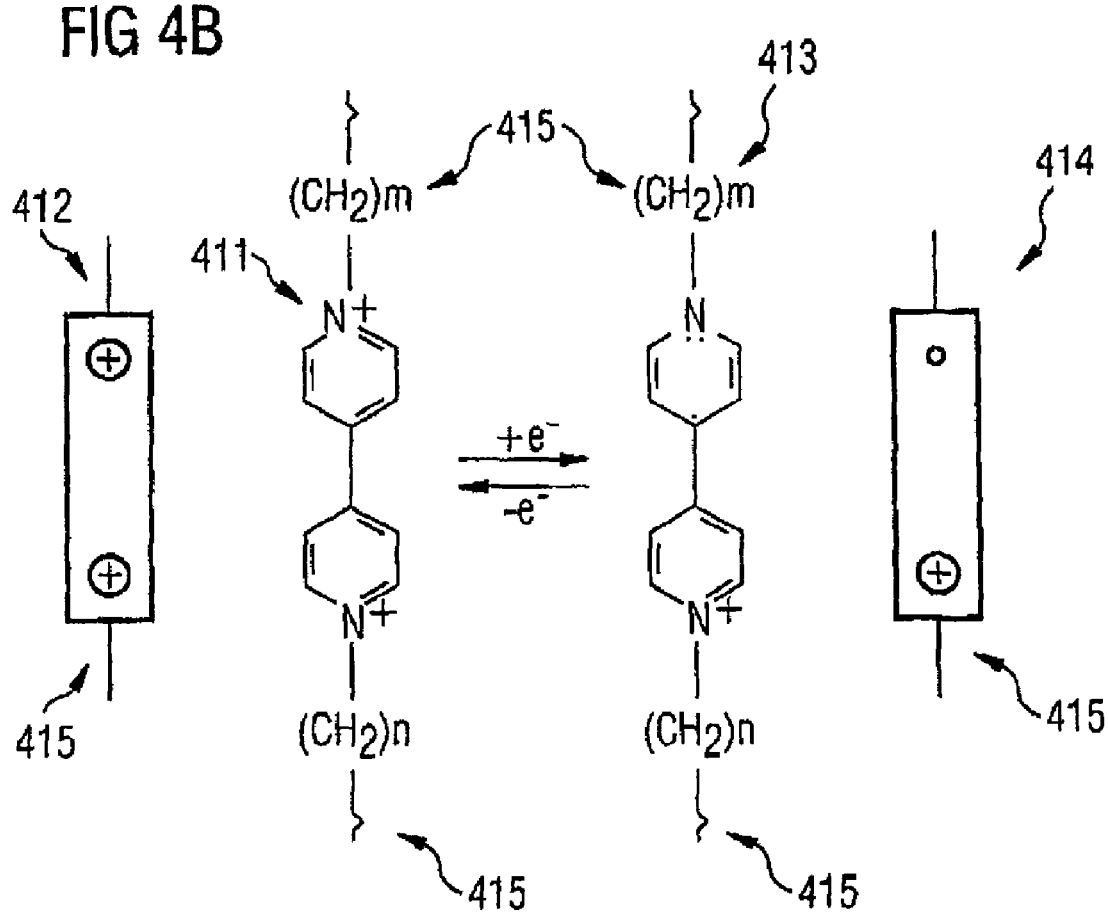
Figure 4C:
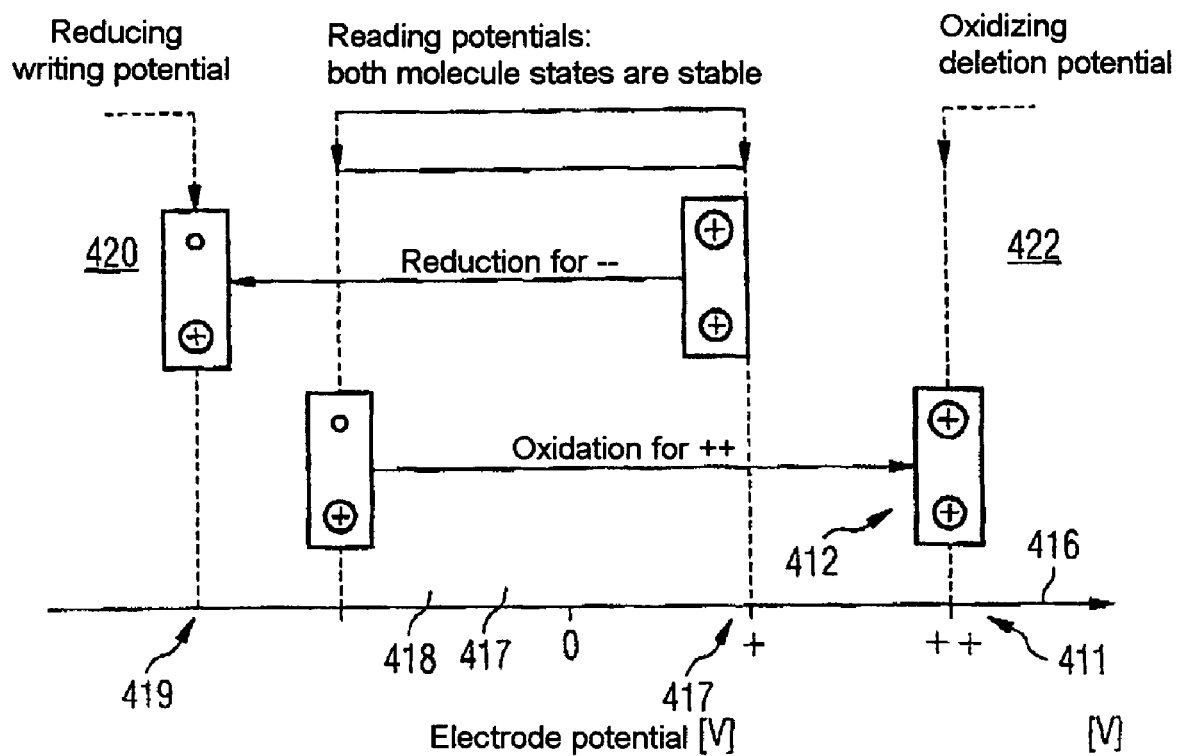

FIGS. 4b and 4c show, schematically, the potential ratios and method of operation (the switching principle) of a circuit element which is in the form of a memory element and is based on the bispyridinium redox system.

The double positively charged cation 411, which has the reference number 412 in the schematic illustration, is the species which is not conductive below a predetermined reduction potential.

Above this predetermined reduction potential, the cation 411 represents an electron acceptor. Under the reception of an electron, the double positively charged cation is converted to the single positively charged radical cation 413 (414 in the schematic illustration). The free electron makes the radical cation electrically conductive. This state exists below the oxidation potential of the radical cation 413. Above the oxidation potential, the radical cation in consequence represents an electron donor. The alkyl chains, which are identified by the reference number 415, which are bonded to the pyridine ring system via the nitrogen atom of the respective ring do not intrinsically take part in the redox process but, instead, act as an insulator. However, substituents incorporated in the alkyl chains, as described above, can influence the position of the redox potential, for example by means of +M and/or +I effects.

Changes in the redox state are still not initiated when small positive or negative potentials 417 (the potential is shown in its relative position on the x axis 416) are applied (FIG. 4c). This range 418 is used for reading the memory cell. The application of a larger negative potential 419 results in reduction of the molecule (transition to the radical cation 414). This range 420 is used for writing to the memory element. If a larger positive potential 421 is applied to the memory element, this results in oxidation of the molecule, that is to say conversion to the dication 412. This range 422, which starts at the potential 421, is used for deletion of the memory element. Since this redox process is reversible, any desired number of writing, reading and deletion processes can be carried out.

Figure 5:
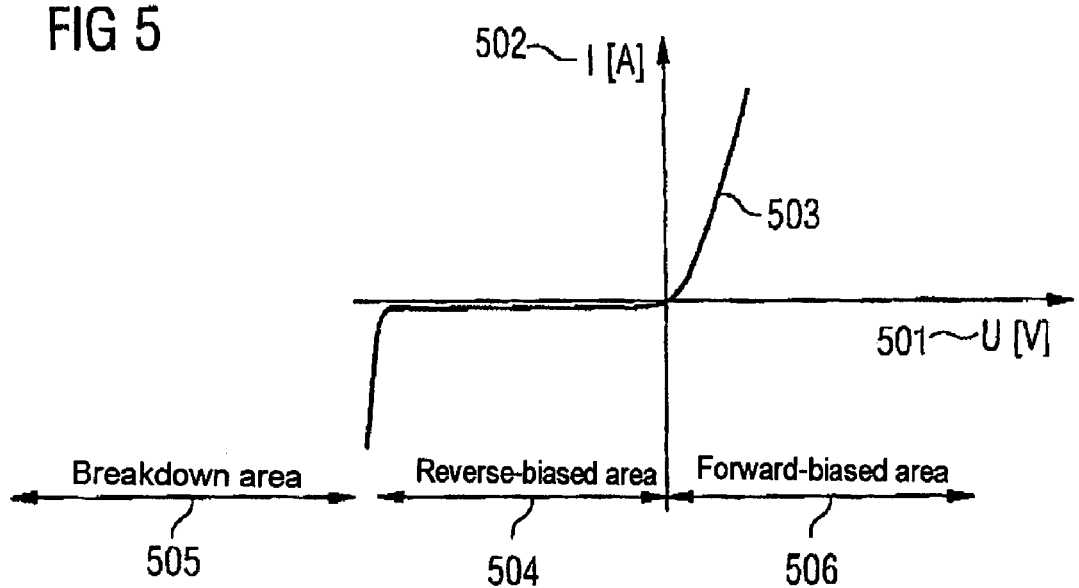
FIG. 5 shows a schematic illustration of a diode characteristic, as is provided by the molecules which are used here and can transport electrons.

FIG. 5 shows a schematic illustration of a diode characteristic, as is provided by the molecules that are used here and can transport electrons. The characteristic 503 is shown as a graph of the electrical current (I) 502 plotted against the voltage (V) 501. The characteristic has a reverse-biased area 504 as well as a forward-biased area 505 and 506 for greater negative and positive potentials, respectively. The breakdown area in this case does not destroy the diode function. The potential range 504 on the forward-biased line and the reverse-biased characteristic is used for reading a circuit element as disclosed here. In contrast, the breakdown area 505 and 506 is also used for programming and for deletion of the diode. On the one hand, this ensures that the "molecular diodes" which are described here can absorb a large proportion of the voltage in the reverse-biased area 504. On the other hand, the diode, and thus the circuit element according to the invention, can be programmed in both directions, that is to say by emitting or absorbing electrons, by means of the breakdown area 505, 506.

Figure 6:
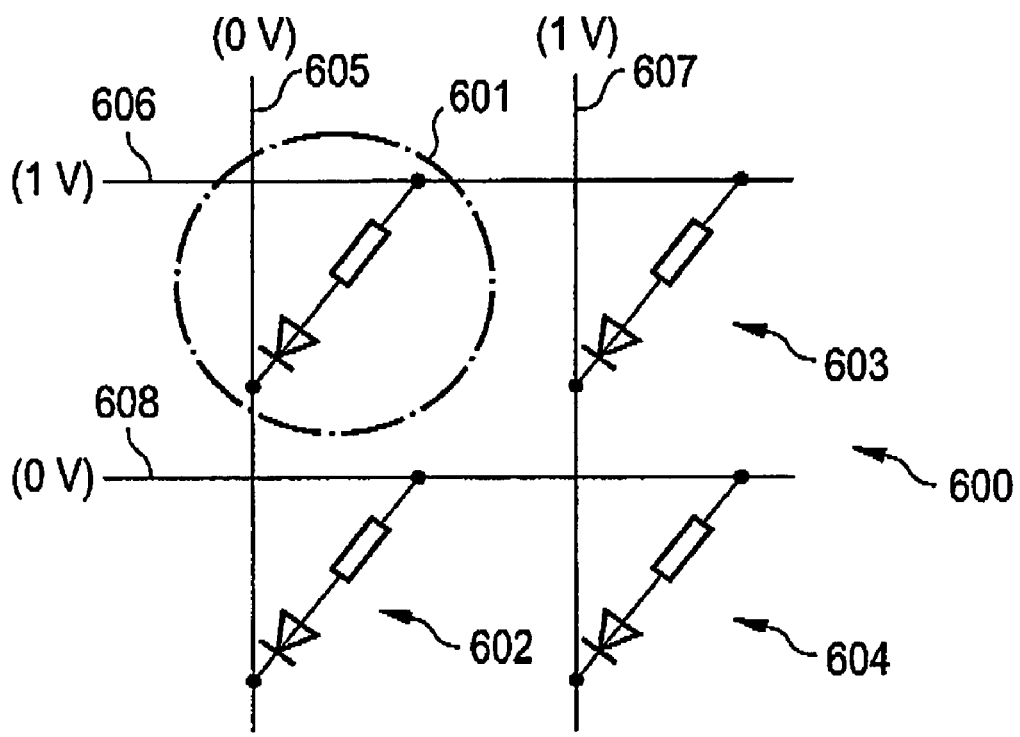
FIG. 6 shows a schematic illustration of the reading process, which can be carried out with a refinement of the memory element as a memory unit comprising a number of memory elements.

FIG. 6 shows a schematic illustration of the reading process, which can be carried out with a refinement of the memory element as a memory unit comprising a number of memory elements.

In this example, the diode thresholds are at −2.2 volts (breakdown) and 0.8 V (forward-biased). The diode ideally conducts perfectly both in the breakdown area and in the forward-biased area, while it provides perfect blocking in the reverse-biased area. For reading, a voltage of 0.2 V is applied to the resistance (that is to say to the electrically active molecules), while a voltage of 1.2 V is sufficient for programming (writing, deletion).

During the reading process as shown in FIG. 6, the cell 601 (which is marked by a circle) in the memory element 600 according to the invention is read. The cells 602, 603 and 604 are not read. In order to read the cell 601, a voltage of 0 V is applied to the addressed bit line 605, while a voltage of 1 V is applied to the addressed word line 606. The diode which is formed in the cell 601 is thus forward-biased, and the resistance can be determined.

0 V is applied to those word lines which are not being addressed, and 0 V is applied to those bit lines which are not being addressed. The bit line which is not being addressed at the cell 602 and the cell 603 which is not being addressed on the word line 608 thus have no voltage drop, while the cell 604 which is not being addressed blocks the word lines and bit lines which are not being addressed. In consequence, no fault currents flow.

Figure 7A:
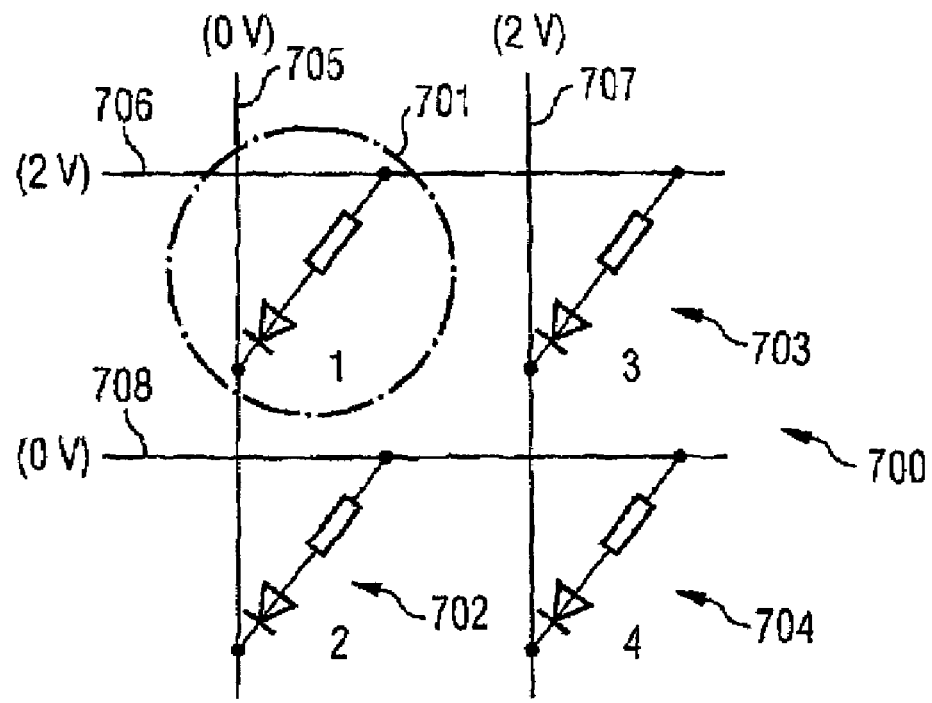
FIGS. 7a and 7b show schematic illustrations of the programming process which can be carried out with a refinement of the memory element as a memory unit comprising a number of memory elements.

FIG. 7a illustrates, schematically, the programming process which can be carried out with a refinement of the memory element as a memory unit comprising a number of memory elements.

In this case, a voltage of 2 volts is applied to the addressed word line 706, and a voltage of 0 volts is applied to the bit line 705. The diode is forward-biased, and still has a voltage drop of 0.8 volts. This results in a voltage drop of 1.2 V across the resistance in the addressed cell 701, which is sufficient to program the cell 701 with the corresponding data item. A voltage of 0 volts is applied to the word line 708 which is not being addressed, and a voltage of 2 volts to the bit line 707 which is not being addressed. There is thus no voltage drop across the cells 702 and 703. A voltage of 2 volts is applied in the reverse-biased direction to the cell 704, and this is virtually completely absorbed by the diode.

Figure 7B:
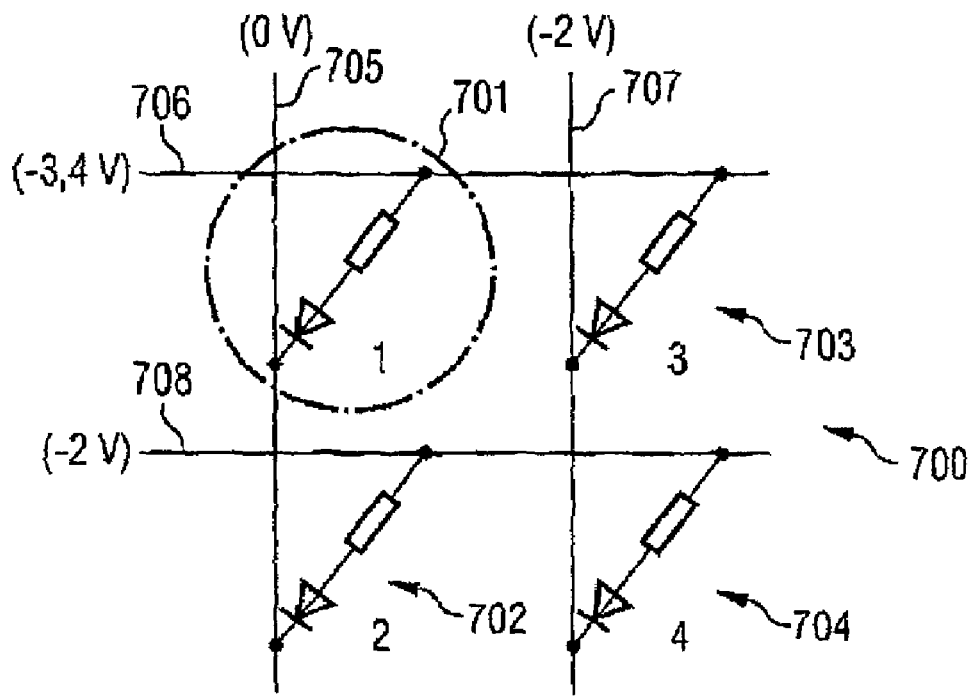

FIG. 7b shows the opposite programming process. If a voltage of 0 volts is applied to the addressed bit line 705 and −3.4 volts is applied to the addressed word line 706 in order to program the inverse data item, and a voltage of −2 volts is furthermore applied to the lines 707 and 708, the diode in the addressed cell 701 changes to its breakdown voltage. The diodes in the cells 702 and 703 are reverse-biased, while no voltage is applied to the cell 704. No fault currents occur in those cells which are not being addressed in this case either. This means that the memory element described here is not susceptible to fluctuations.

Figure 8:
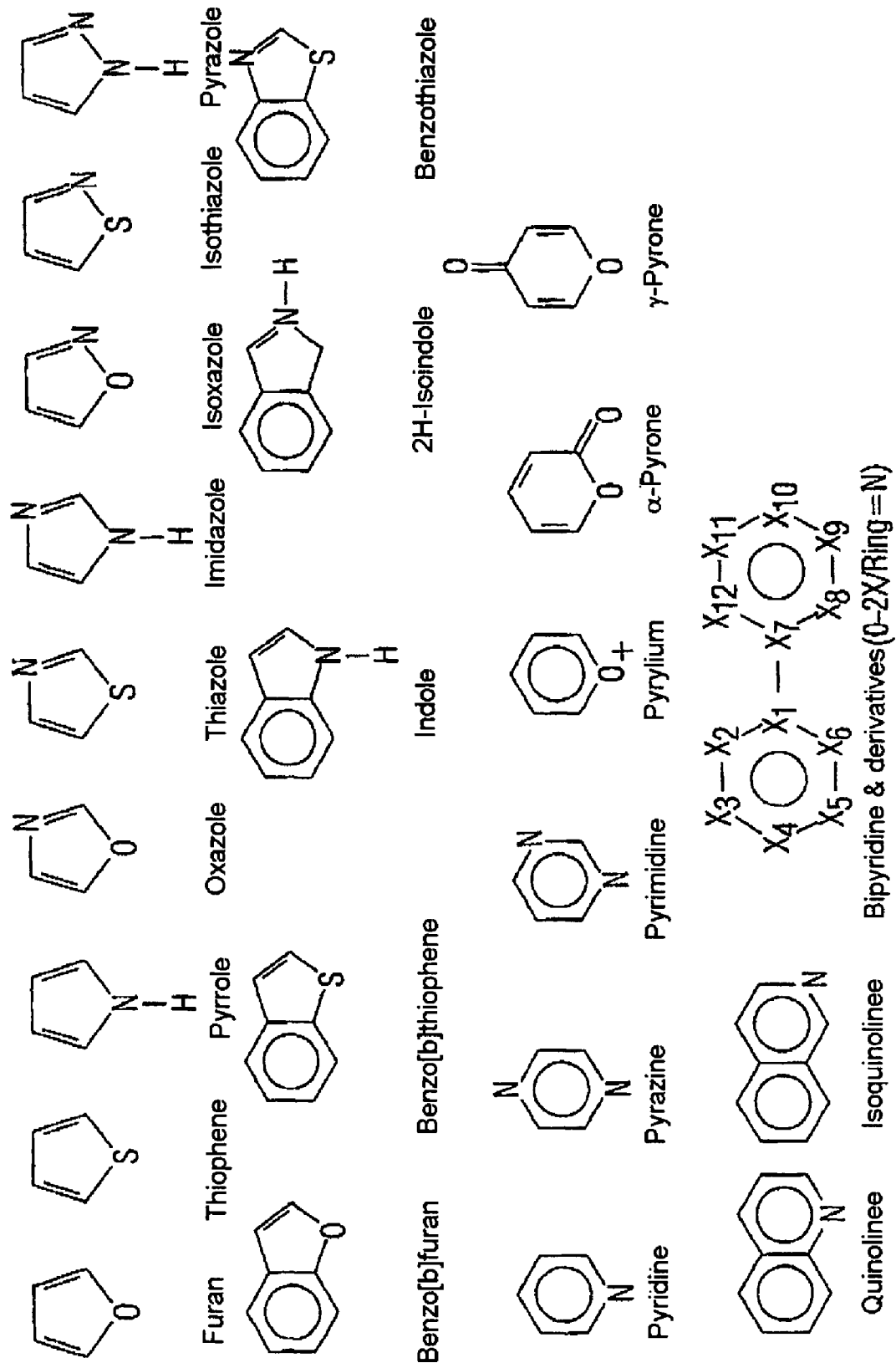
FIG. 8 shows aromatic groupings which can be used as anchor groups in the electrically active molecules.

FIG. 8 shows aromatic groupings which can be used as anchor groups in the electrically active molecules.

Figure 9:
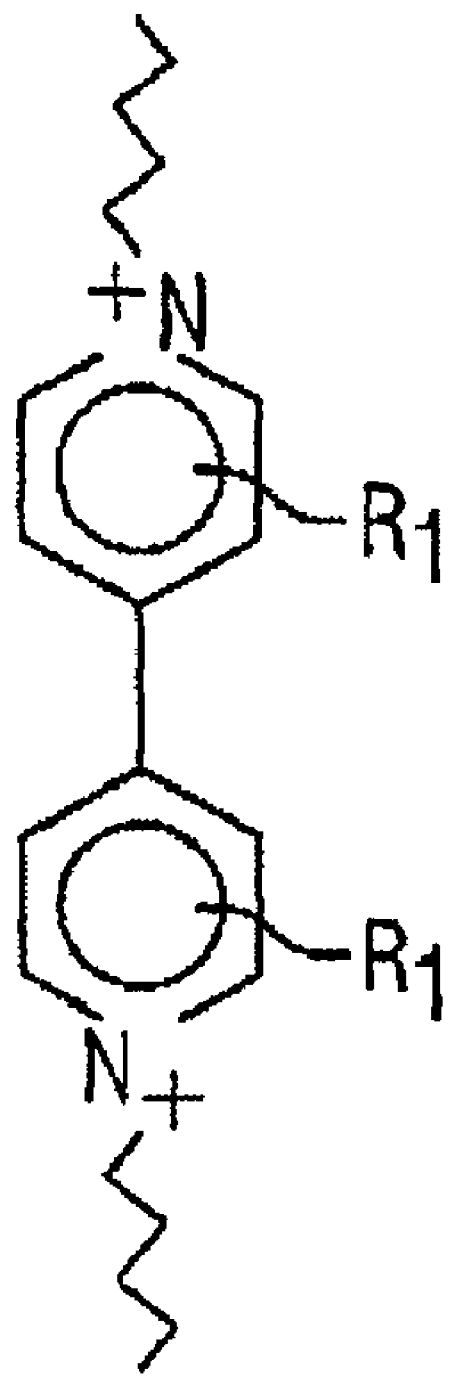
FIG. 9 shows the substrate of a redox-active bispyridinium unit, which is substituted asymmetrically with at least one donor and acceptor group.
Figure 12A:
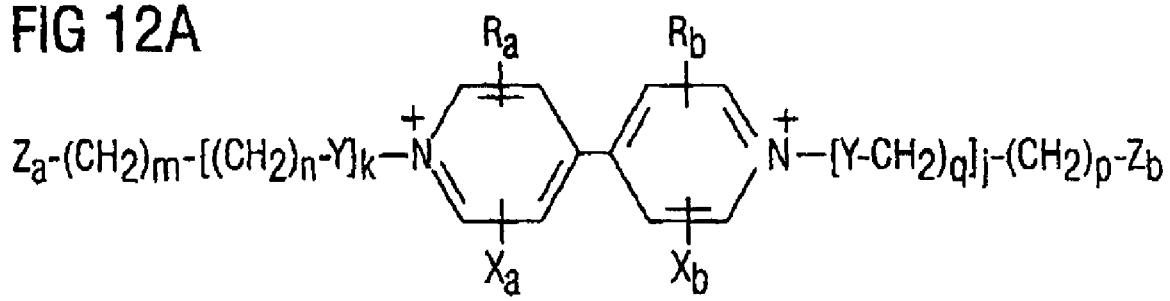
FIGS. 12a to 12d show formula representations of redox-active bispyridinium compounds which are preferably used in the invention.
Figure 12B:
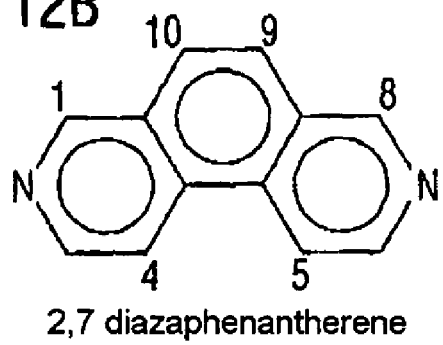
Figure 12C:
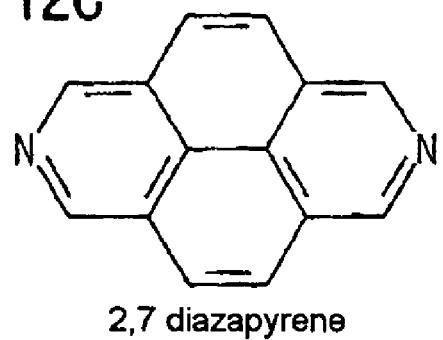
Figure 12D:
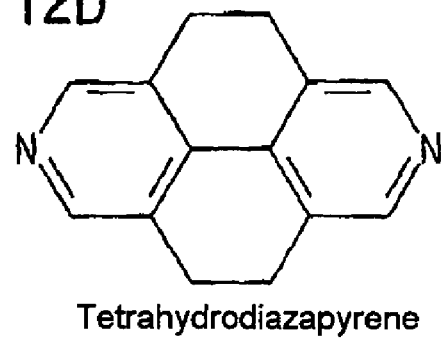

FIG. 9 shows the substrate of a redox-active bispyridinium unit, which is asymmetrically substituted with at least one donor unit $R_1$ and one acceptor unit $R_2$.

FIG. 10a shows a mononuclear molybdenum complex with two multiply bonded sulfur ligands and chelating bisphosphine ligands. The molybdenum atom represents the redox-active center, one of the two bisphosphine ligands is substituted with methyl groups, and acts as a donor unit in the sense of the invention. The other bisphosphine ligand bears electron-attracting (oxygen) substituents, and acts as an electron acceptor unit. The bisphosphine ligands furthermore each have an alkyl chain with an SH or $SiCl_3$ anchor group for immobilization on the two layers 1002 and 1003 of the circuit element 1000.

FIG. 10b shows a ubiquinone derivative. In this case, the quinone group represents the redox-active unit, which is substituted by a —$CH_3$ or a $COOC_2H_5$ group as a donor or acceptor group, respectively, for the purposes of the invention. Furthermore, the ubiquinone group bears, via alkyl chains as a spacer molecule, an —SH or $SiCl_3$ anchor group for immobilization on the two layers 1002 and 1003 of the circuit element. A further example of a redox-active compound with a quinoid system is thionaphtoquinones according to the formula IV

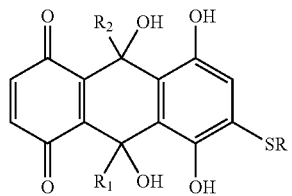

(IV), in which R1 and R2 are different substituents, for example alkyl chains or H. The immobilization on the layer 1002 is carried out by means of the substituent R, which forms a thioether bond with the sulfur atom, which is bonded as a ring substituent, and may, for example, be an aliphatic alkyl chain with a silicon group as the anchor group (see Switching Element and its Manufacturing Method, JKT-9-36389, Feb. 7, 1997).

The invention claimed is:

1. A circuit element comprising:
   a first layer composed of an electrically insulating substrate material;
   a first electrically conductive material which is in the form of at least one discrete area embedded in the substrate material and/or is applied to the substrate material;
   a second layer having a second electrically conductive material; and
   a monomolecular layer, which is composed of electrically active molecules which transport charge carriers, arranged between the first layer and the second layer, wherein the monomolecular layer is immobilized and makes electrical contact with the second layer, wherein each of the electrically active molecules comprises:
      at least one first unit, which is used as an electron donor;
      at least one second unit, which is used as an electron acceptor, wherein the electron donor and the electron acceptor form a diode; and
      at least one redox-active unit, by means of which a variable resistance is formed, arranged between the at least one first unit and the at least one second unit.

2. The circuit element as claimed in claim 1, wherein the redox-active unit has exclusively one organic basic structure.

3. The circuit element as claimed in claim 1, wherein the redox-active unit has a metal center.

4. The circuit element as claimed in claim 1, wherein the electrically active molecules on the at least one area composed of the first electrically conductive material are immobilized via an anchor group which is selected from the group consisting of —SH, —COOH, —CONH2, —COSH, —OCN, —NCO, —CN, —S—SH, —$NR_2$, —$PR_2$, —$SiR_xCl_{3-x}$ (where x=0,1,2), where R represents any desired suitable substituents, preferably hydrogen, alkyl, aryl or arylalkyl.

5. The circuit element as claimed in claim 1, wherein electrically inert molecules located on the at least one discrete area composed of the first electrically conductive material are additionally immobilized.

6. The circuit element as claimed in claim 1, wherein electrically inert molecules located on the first layer composed of the electrically insulating substrate material are immobilized, and form a matrix which surrounds the at least one discrete area with the monomolecular layer composed of redox-active molecules.

7. The circuit element as claimed in claim 1, wherein a plurality of discrete areas composed of the first electrically conductive material are embedded in the substrate material and/or are applied to the substrate material.

8. The circuit element as claimed in claim 1, wherein the first electrically conductive material is gold or silver.

9. The circuit element as claimed in claim 1, wherein the layer composed of the second electrically conductive material has gold, titanium, and/or aluminum.

10. The circuit element as claimed in claim 1, wherein the second layer with the second electrically conductive material is configured such that the second electrically conductive material is arranged as discrete areas on a layer composed of an insulator material, and/or is embedded in the layer composed of insulator material.

11. The circuit element as claimed in claim 1, wherein the first electrically conductive material and the second electrically conductive material are in a form of electrodes.

12. The circuit element as claimed in claim 2, wherein the at least one first unit, which is used as an electron donor, and/or the at least one second unit, which is used as an electron acceptor are/is bonded as substituents to different atoms in the organic basic structure of the redox-active unit.

13. The circuit element as claimed in claim 2, wherein the redox-active unit is a bispyridinium unit.

14. The circuit element as claimed in claim 3, wherein the redox-active unit is an individual metal atom or a multinuclear metal center.

15. The circuit element as claimed in claim 3, wherein the metal center has at least one metal selected from the group consisting of actinides, lanthanoids, elements in the first transition group of the periodic table, elements in the sixth transition group of the periodic table, elements in the seventh transition group of the periodic table, and elements in the eighth transition group of the periodic table.

16. The circuit element as claimed in claim 3, wherein the redox-active unit is an organo-metal compound or an inorganic coordination compound.

17. The circuit element as claimed in claim 3, wherein the at least one first unit, which is used as an electron donor, and the at least one second unit, which is used as an electron acceptor, is a complexing ligand of the metal center.

18. The circuit element as claimed in claim 3, wherein the metal center is bonded to an essentially planar macrocyclic polydentate ligand, which has a conjugated π electron system.

19. The circuit element as claimed in claim 3, wherein the redox-active unit is covalently or coordinatively bonded to the structure of the electrically active molecules.

20. The circuit element as claimed in claim 11, wherein the circuit element is a memory element.

21. The circuit element as claimed in claim 15, wherein the metal is selected from the group consisting of Fe, Co, Cr, Mb, Mn, Ru, and Mo.

22. The circuit element as claimed in claim 16, wherein the inorganic coordination compound is a mononuclear molybdenum complex having two multiply-bonded chalcogen ligands, and chelating bisphosphine ligands, or a binuclear chromium complex with bridging α-metallacarboxylates as ligands.

23. The circuit element as claimed in claim 18, wherein the macrocyclic polydentate ligand is phthalocyanine, naphthalocyanine, tetrazaphorphyrin, or a derivative thereof.

24. A method for production of a circuit element, comprising the steps of:
providing a layer composed of an insulating substrate material;
embedding a first electrically conductive material in the substrate material and/or applying the first electrically conductive material to the substrate material, at at least one discrete position;
immobilizing electrically active molecules, which transports charge carriers, as a monomolecular layer on the at least one discrete area composed of the first electrically conductive material, wherein each electrically active molecule includes at least one first unit, which is used as an electron donor, and at least one second unit, which is used as an electron acceptor, wherein the electron donor and the electron acceptor form a diode, and a redox-active unit, by means of which a variable resistance is formed, arranged between the at least one first unit and the at least one second unit; and
applying a second layer having a second electrically conductive material to the monomolecular layer with the redox-active molecules, resulting in he redox-active molecules coming into contact with the second electrical material in the second layer.

25. The method as claimed in claim 24, wherein after the step of immobilizing the electrically active molecules which transports electrons, performing the step of immobilizing electrically inert molecules located on the first layer composed of the electrically insulating substrate material, resulting in the electrically inert molecules forming a matrix, which surrounds the at least one area with the monomolecular layer having the redox-active molecules.

* * * * *

UNITED STATES PATENT AND TRADEMARK OFFICE
CERTIFICATE OF CORRECTION

PATENT NO. : 7,283,372 B2
APPLICATION NO. : 10/857635
DATED : October 16, 2007
INVENTOR(S) : Werner Weber et al.

It is certified that error appears in the above-identified patent and that said Letters Patent is hereby corrected as shown below:

Under Other Publications item (56), page 2, line 38, "Silcon" should read --Silicon--

In the Specification:

At column 4, line 42, "phthalocyaninyl" should read --phthalocyanine--

At column 5, line 10-11, "phthalocyaninyl" should read --phthalocyanine--

At column 5, line 40, "$M_1 + x.e^- \rightleftharpoons M_1^{x.e-}$." should read --$M_1 + x \cdot e^- \leftrightarrow M_1^{x \cdot e-}$.--

At column 6, line 53, "diphenylphosphinoethene" should read --diphenylphosphinoethane--

At column 6, line 54, "ethene" should read --ethane--

At column 7, line 23, "$Cu^{2+.}$" should read --$Cu^{2+}$.--

At column 9, line 52, "$[PtCl_4]^{2-.}$" should read --$[PtCl_4]^{2-}$.--

At column 10, line 38, "nitrites" should read --nitriles--

At column 19, line 50, "nitrites" should read --nitriles--

At column 20, line 9, "material at at least" should read --material at least--

UNITED STATES PATENT AND TRADEMARK OFFICE
CERTIFICATE OF CORRECTION

PATENT NO. : 7,283,372 B2
APPLICATION NO. : 10/857635
DATED : October 16, 2007
INVENTOR(S) : Werner Weber et al.

It is certified that error appears in the above-identified patent and that said Letters Patent is hereby corrected as shown below:

Col. 28, Claim 24, line 14, "material, at at least" should read --material, at least--

Signed and Sealed this

Fifteenth Day of April, 2008

JON W. DUDAS
*Director of the United States Patent and Trademark Office*